United States Patent [19]
Uenishi et al.

[11] Patent Number: 5,443,999
[45] Date of Patent: Aug. 22, 1995

[54] METHOD OF FABRICATING A FLASH CONTROL DEVICE WHICH USES CASCADE-CONNECTED THYRISTOR AND MOSFET

[75] Inventors: Akio Uenishi; Hiroshi Yamaguchi; Yasuaki Fukumochi, all of Fukuoka, Japan

[73] Assignee: Mitsubishi Denki Kabushiki Kaisha, Tokyo, Japan

[21] Appl. No.: 298,955

[22] Filed: Sep. 1, 1994

Related U.S. Application Data

[62] Division of Ser. No. 911,670, Jul. 9, 1992, Pat. No. 5,379,089, which is a division of Ser. No. 663,431, Mar. 1, 1991, Pat. No. 5,151,762.

[30] Foreign Application Priority Data

| Apr. 12, 1990 | [JP] | Japan | 2-98021 |
| Apr. 26, 1990 | [JP] | Japan | 2-111119 |
| Nov. 2, 1990 | [JP] | Japan | 2-298668 |

[51] Int. Cl.⁶ .................................. H01L 49/00
[52] U.S. Cl. ............................ 437/6; 437/41; 437/43; 437/50; 437/59; 437/152; 437/911; 148/DIG. 126
[58] Field of Search ............ 257/133, 146; 437/6, 437/911, 41, 43, 50, 152, 59, 31; 148/DIG. 126

[56] References Cited

U.S. PATENT DOCUMENTS

| 4,644,637 | 2/1987 | Temple | 29/571 |
| 4,760,431 | 7/1988 | Nakagawa et al. | 357/234 |
| 4,847,671 | 7/1989 | Pattanayak et al. | 357/38 |
| 4,912,541 | 3/1990 | Baliga et al. | 357/38 |
| 4,963,972 | 10/1990 | Shinohe et al. | 357/38 |
| 5,053,838 | 10/1991 | Fujihira | 357/23.4 |
| 5,084,401 | 1/1992 | Hagino | 437/152 |
| 5,151,762 | 9/1992 | Uenishi et al. | 357/23.4 |
| 5,194,394 | 3/1993 | Terashima | 437/6 |
| 5,264,378 | 11/1993 | Sakurai | 437/6 |
| 5,286,981 | 2/1994 | Liya et al. | 437/6 |
| 5,324,670 | 6/1994 | Terashima | 437/50 |
| 5,379,089 | 1/1995 | Uenishi et al. | 354/416 |

FOREIGN PATENT DOCUMENTS 0227476 9/1989 Japan .................. 437/911

Primary Examiner—Olik Chaudhuri
Assistant Examiner—Long Pham
Attorney, Agent, or Firm—Oblon, Spivak, McClelland, Maier & Neustadt

[57] ABSTRACT

A semiconductor device is formed from a thyristor and a MOSFET cascade-connected in which the thyristor includes a bipolar transistor cascade-connected with the MOSFET, the base (p semiconductor region) of which is adapted to be punched through by the application of a working voltage. Thus, the thyristor can easily be latched and unlatched in response to the turn-on and turn-off of the MOSFET. Thus the semiconductor device can be securely on/off controlled by only the single gate (G) of the MOSFET. By using such semiconductor device as a switching element in a flash control device, a high performance flash control device with high flashing efficiency is provided.

6 Claims, 21 Drawing Sheets

METHOD OF FABRICATING A FLASH CONTROL DEVICE WHICH USES CASCADE-CONNECTED THYRISTOR AND MOSFET

This is a division of application Ser. No. 07/911,670, filed on Jul. 9, 1992 now U.S. Pat. No. 5,379,089, which is a divisional application of Ser. No. 07/663,431, filed on Mar. 1, 1991 now U.S. Pat. No. 5,151,762.

BACKGROUND OF THE INVENTION

1. Field of the Invention

The present invention relates to a semiconductor device for high-voltage and high-speed switching use as seen in an inverter, a fabricating method thereof and a flash control device using the semiconductor device.

2. Description of the Prior Art

Conventionally, an inverter with capacity up to several hundred KVA has been produced using a bipolar transistor, but a power device high in switching speed hence high in switching frequency is being sought for realizing a small-sized high-performance device. For such usage an insulated gate bipolar transistor (IGBT) has been proposed and easily realizes high-voltage and high-speed switching control up to about several tens of KHz as the IGBT has low gate drive loss characteristics.

FIG. 1 is sectional construction showing a conventional IGBT, and FIG. 2 is a circuit diagram showing an equivalent circuit thereof. In reference to FIG. 1, an n+ type semiconductor layer 102 is formed on p+ type semiconductor substrate 101 and on the layer an n− type drift layer 103 is formed. On the surface of the n− type drift layer 103 p type well regions 104 are formed by selective diffusion and on the surface of each p type well region an n+ type emitter region 105 is formed by selective diffusion. Surface portions for the p type well region 104 between the n− type drift layer 103 and the n+ type emitter regions 105 are defined as channel regions 106. Channel length is set to be around a few microns. On the channel regions 106 a gate electrode 108 is formed through a gate oxidized film 107 and on the p type well regions 104 and n type emitter regions 105 an emitter electrode 109 is formed. An insulation film 110 is put between the electrodes 108 and 109 to insulate them. On the back of the p+ type semiconductor substrate 101 a collector electrode 111 is formed.

In the equivalent circuit in FIG. 2, an n channel MOSFET 201 represents a MOSFET composed of vertical type MOS structure occupying a part above the n− type drift layer 104 in FIG. 1, and a pnp transistor 202 represents a bipolar transistors with p+n+n−p structure composed of the p+ type semiconductor substrate 101, the n+ type semiconductor layer 102, the n− type drift layer 103 and the p type well regions. 104. A resistor 203 represents resistance components of the n− type drift layer 103 in FIG. 1.

When voltage between gate and emitter terminals G and E is sufficiently low and therefore MOSFET 201 is turned off, and positive bias voltage is applied between collector and emitter terminals G and E, and n−p diode between the n type drift layer 103 and the p type well regions 104 is reversely biased a depletion layer expands mainly into the n− type drift layer 103 side to form space charges so that high collector voltage can be blocked. In addition the surface of the n− type drift layer 103 can be made to have high breakdown voltage due to field plate effects by MOS structure. Accordingly to obtain a high breakdown voltage device, the n− type drift layer 103 should be designed to be lower in donor density (high resistivity) and thicker. However this easily causes the rise of the resistance value of the resistor 203 and results in a cause of lowering of current capacity.

When voltage between the collector and emitter terminals C and E is increased under condition that the MOSFET 201 is turned on by applying sufficient voltage between the gate and emitter terminals G and E, electrons flow through a channel of the MOSFET 201 from the emitter electrode 109 to the collector electrode 111. In this way a junction between a base and an emitter of the pnp transistor 202 is forward biased, the transistor 202 becomes active and a path between the collector and emitter terminals C and E of the IGBT is formed. At this time the pnp transistor 202 supplies current by amplifying drain current of the MOSFET 201. Accordingly the current capacity of the IGBT becomes higher as the amplification factor of the IGBT becomes higher as the amplification factor of the pnp transistor 202 is higher and the drain current of the MOSFET 201 is greater, also resulting in lowering of ON state voltage. However if the amplification factor of the pnp transistor 202 is raised, turn-off characteristics become poor. Though turn-off time below 1 μs is required in applicating to a high-frequency inverter, if this case is realized using an IGBT of high breakdown voltage of about 1,000 V, the current amplification factor of the pnp transistor 202 must be pretty lowered. Therefore the following is devised: introduction of a life time killer by irradiation of electron beams or protons or diffusion of heavy metals; addition of short emitter resistance to the transistor 202. As a result, in an IGBT high in speed of turn-off characteristics, there is a problem that as the current amplification factor of the pnp transistor 202 becomes less, current density cannot be raised enough for satisfying specification for the upper limit of ON state voltage.

As a method to improve trade-off between the turnoff characteristics and ON state voltage, the following has conventionally been devised as shown by 112 in FIG. 3: donor density in the vicinity of the surface of the n− drift layer 103 has been raised to lower series resistance 203 of the MOSFET 201. In addition, by virtue of this low resistance layer 112, expansion of a depletion layer advancing from the junction with the p type well regions 104 in an ON state is suppressed, so that it becomes possible for a high breakdown voltage device to be fine patterned. That is, the following is a conventional way of thinking for raising performance: since according to structure in FIG. 3 drain current can be increased by raising the current capacity of the MOSFET 201, high current density can be obtained even if the amplification factor of the pnp transistor 202 is small.

In another method to improve trade-off between turnoff characteristics and ON state voltage, a device MOSGTO is proposed. FIG. 4 is a cross-sectional view showing the structure of the MOSGTO and FIG. 5 is a circuit diagram showing the equivalent circuit thereof. In reference to FIG. 4, on a p+ type semiconductor substrate 301, an n+ type semiconductor layer 302, an n− type semiconductor layer 303 and a p type semiconductor layer 304 are piled up in this order. On the surface of the p type semiconductor layer 304 n type well regions 305 are formed by selective diffusion and on the surface of each n type well region 305 a p+ type source region 306 is formed by selective diffusion. Surface portions of the n type well regions 305 between the p type semiconductor layer 304 and the p+ type source regions 306 are defined as regions 307. On the p type semiconductor layer 304 a first gate electrode 308 is formed and on the channel regions 307 second gate electrodes 310 are formed through gate insulation films 309. Further on the n type well regions 305 and the p+ type source regions 306 cathode electrodes 311 are formed. These electrodes 308, 310 and 311 are insulated by insulation films 312. On the back of the p+ type semiconductor substrate 301 an anode electrode 313 is formed.

In an equivalent circuit in FIG. 5, a p channel MOSFET 401 represents a MOSFET composed of vertical type MOS structure of an upper portion above the p type semiconductor layer 304 and a pnp transistor 402 represents a bipolar transistor with p+n$^{30}$n$^-$p structure composed of the p+ type semiconductor substrate 301, the n+ type semiconductor layer 302, the n$^-$ type semiconductor layer 303 and the p type semiconductor layer 304. An npn transistor 403 represents a bipolar transistor with n$^-$pn structure composed of the n$^-$ type semiconductor layer 303, the p type semiconductor layer 304 and the n type well regions 305.

As regards turning on the MOSGTO, when positive bias is applied between anode and cathode terminals A and K and trigger current is flowed into a first gate terminal G1, a thyristor composed of transistors 402 and 403 is latched to open a path between anode and cathode terminals A and K. When negative voltage is applied to a second gate terminal G2 to turn the MOSFET 401 on to unlatch the thyristor, the MOSGTO is turned off.

Since this device is of thyristor structure, ON state voltage can be made low even under high voltage. However the turn-off mechanism is equivalent to a cut-off of a GTO without gate reverse bias, so that it is difficult to raise anode current enough. In addition the operability is not good because is has two gate electrodes and therefore complicated gate control is necessary for firing and cut-off. So-called MOS controlled thyristor (MCT) conducts the firing gate control of a MOSGTO by a MOS gate, but this has the same turn-off mechanism as a MOSGTO, having the same problems as the above MOSGTO.

As a device which is improved in the above difficulties and realizes high breakdown voltage, low ON resistance, high-speed turn-off and high blockable main current density, an emitter switched thyristor (EST) is proposed. FIG. 6 is a cross-sectional view showing EST structure disclosed in IEEE electron Device Letters, Vol. 11, No. 2, February 1990 "The MOS-Gated Emitter Switched Thyristor", B. Jayant Baliga. FIG. 7 is a circuit diagram showing an equivalent circuit thereof. In reference to FIG. 6, on a p+ type semiconductor substrate 501 an n type buffer layer 502, an n$^-$ type drift layer 503 and a p type base layer 504 are piled up in this order. On the surface of the p type base layer 504 an n+ type floating region 505 and an n+ type emitter region 506 are selectively formed. The surface portion of the p type base region 504 between the n+ type floating region 505 and the n+ type emitter region 506 is defined as a channel region 507. Except for the channel region 507 an p+ type region 508 is provided surrounding the n+ type emitter region 506 to reduce base resistance. On the channel region 507 a gate electrodes 510 is formed through a gate insulation film 509 and on the n+ type emitter region 506 and the p+ type region 508 a cathode electrode 511 is formed. On the back of the p+ type semiconductor substrate 501 an anode electrode 512 is formed.

In an equivalent circuit in FIG. 7, an n channel MOSFET 601 corresponds to MOSFET composed of MOS structure above the p type base region 504 in FIG. 6 and a pnp transistor of the p+ type semiconductor substrate 501, the n type buffer layer 502, the n$^-$ type drift layer 503 and the p type base region 504. An npn transistor 603 corresponds to a bipolar transistor with n$^-$pn+ structure composed of the n$^-$ type drift layer 503, the p type base layer 504 and te n+ type floating region 505. A resistor 604 expresses resistance component of the p type base layer 504.

For turning on this EST, it is necessary to supply the p type base layer 504 with trigger current so that the thyristor composed of the transistors 602 and 603 is made triggered and latched, under conditions that positive bias is applied across anode and cathode terminals A and K and positive voltage is applied on a gate terminal G to turn the MOSFET 601 on. Therefore as described in the above literature, a gate terminal $G_T$ used for supplying trigger current similar to the first gate terminal G1 in FIG. 4 and FIG. 5 must be suitably provided on the p type base later 504. In an equivalent circuit in FIG. 7, this gate terminal $G_T$ is shown in a dotted line. On the other hand by making zero voltage applied on the gate terminal G to turn the MOSFET 601 off, the thyristor is unlatched and the EST is turned off.

Since the EST is, like the MOSGTO mentioned before, of thyristor structure, ON state voltage can be made low even in a high breakdown voltage case. In addition as turn-off control is made by a channel of the MOSFET 601 cascade-connected to the thyristor portion, blockable anode current is higher than the MOSGTO. Furthermore as an amplification factor of the transistor 602 can be made lower, high speed turn-off becomes possible. However since it requires two gate electrodes as the MOSGTO, there arises problems of troublesome gate control. There also arise problems that mounting density of the device lowers owing to extra gate electrodes and realizable current density becomes less.

As explained above, semiconductor devices conventionally proposed or used have respective problems. That is, an IGBT has trade-off speed and hence it is difficult to satisfy all of them. MOSGTO and MCT can realize high breakdown voltage and low ON state resistance, but there are problems that blockable main current density is low and two gate electrode are necessary so that gate control is complicated. On the other hand, EST can realize high breakdown voltage, low ON state resistance, high speed turn-off and high blockable main current density, but as two gate electrodes are necessary there are problems that gate control is complicated. In addition there also are problems that mounting density of the device cannot be increased due to extra gate electrodes.

Furthermore, as will be described later in detail, when such conventional semiconductor devices are applied to a flash control device used for a supplementary light source in taking a photograph, there are problems in flashing efficiency, making the device smaller and low-priced, so that enough satisfactory performance cannot be realized.

SUMMARY OF THE INVENTION

A semiconductor device in accordance with the present invention comprises a first conductivity type first semiconductor layer having first and second major surfaces, a second conductivity type second semiconductor layer formed on said first major surface of said first semiconductor layer, a first conductivity type first semiconductor region of relatively low first impurity concentration selectively formed in a surface of said second semiconductor layer, a first conductivity type second semiconductor region of relatively high second impurity concentration selectively formed in the surface of said second semiconductor layer adjacently to said first semiconductor region, a second conductivity type third semiconductor region formed in at least a portion of a surface of said first semiconductor region, a second conductivity type fourth semiconductor region selectively formed in a surface of said second semiconductor region at a distance from said first semiconductor region, surface portions of said first and second semiconductor regions between said third and fourth semiconductor regions being defined as a channel, a gate insulation film formed on said channel, a gate electrode formed on said gate insulation film, a first main electrode formed to spread on said second and fourth semiconductor regions, and a second main electrode formed on said second major surface of said first semiconductor layer, wherein said first impurity concentration is so set that said first semiconductor region is completely depleted when a working voltage is applied across said first and second main electrodes in an off state of said semiconductor device, and said second impurity concentration is so set that said channel has a threshold voltage of a predetermined value in an enhancement mode.

A fabricating method of a semiconductor device in accordance with the present invention comprises the steps of preparing a first conductivity type first semiconductor layer having first and second major surfaces, forming a second conductivity type second semiconductor layer on said first major surface of said first semiconductor layer, selectively forming a first conductivity type first semiconductor region of relatively low first impurity concentration in a surface of said second semiconductor layer, selectively forming a first conductivity type second semiconductor region of relatively high second impurity concentration in the surface of said second semiconductor layer adjacently to said first semiconductor region, forming a second conductivity type third semiconductor region in at least a portion of a surface of said first semiconductor region, selectively forming a second conductivity type fourth semiconductor region in a surface of said second semiconductor region at a distance from said first semiconductor region, surface portions of said first and second semiconductor regions between said third and fourth semiconduction regions being defined as a channel, forming a gate insulator film on said channel, forming a gate electrode on said gate insulation film, forming a first main electrode to spread on said second and fourth semiconductor regions, and forming a second main electrode on said second major surface of said first semiconductor layer, wherein said first impurity concentration is so set that said first semiconductor region is completely depleted when a working voltage is applied across said first and second main electrodes in an off state of said semiconductor device, and said second impurity concentration is so set that said channel has a threshold voltage of a predetermined value in an enhancement mode.

A flash control device in accordance with the present invention comprises first and second high voltage source terminals, a flash energy accumulating condenser connected across said first and second high voltage source terminals, a flash discharge tube and a switch element connected in series across said first and second high voltage source terminals, and a trigger circuit connected with said flash discharge tube for triggering said flash discharge tube to start a flash discharge, wherein said switch element is composed of a thyristor element and a MOSFET which are cascade-connected and formed on a single chip.

Accordingly, it is an object of the present invention to provide a semiconductor device and a fabricating method thereof wherein not only high breakdown voltage, low ON state resistance, high speed turn-off and high blockable main current density can be realized but also only one gate electrode usage is possible and as a result mounting- density of the device is raised resulting in realization of high current density.

It is another object of the present invention to provide a high performance flash control device which is high in flashing efficiency and besides capable of being made compact and low-priced.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 8:
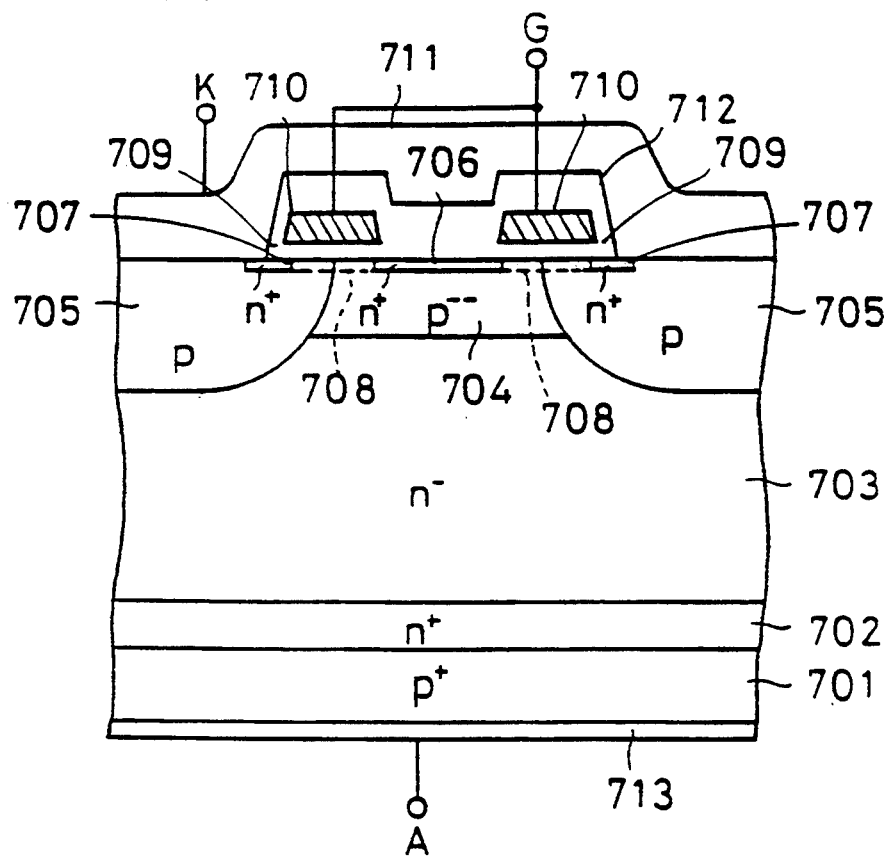
FIG. 8 is a cross-sectional view showing an embodiment of a semiconductor device according to the present invention.
Figure 9:
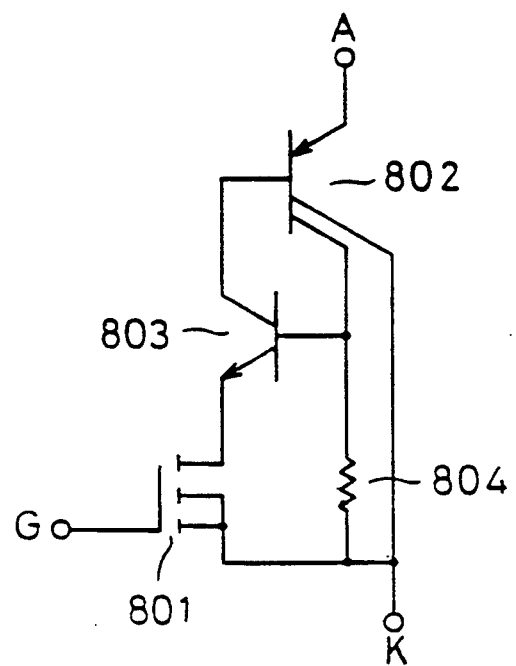
FIG. 9 is a circuit diagram showing the equivalent circuit thereof.

FIG. 8 is a cross-sectional view showing an embodiment of a semiconductor device according to the present invention and FIG. 9 is a circuit diagram showing the equivalent circuit thereof. In reference to FIG. 8, on a p+ type semiconductor substrate 701, an n+ type semiconductor layer 702 and an n− type drift layer 703 are stacked up in this order. The n− type drift layer 703 ma be, for example a 1,000 V class semiconductor device, of around $10^{14}$ cm$^{-3}$ in impurity concentration and around 60 μm in depth. On the surface of the n− drift layer 703 a p−− type semiconductor region 704 is selectively formed. The p−− type semiconductor region 704 may be for example of around $10^{12}$ cm$^{-3}$ to $10^{15}$ cm$^{-3}$ in impurity concentration which is pretty low and around a few μm in depth. Being adjacent to the both sides of the p−− type semiconductor region 704, on the n− type drift layer 703 p type semiconductor region 705 are selectively formed to be well-like. The p type semiconductor regions 705 may be for example, at edges of channel regions 708 on the side of n+ semiconductor regions 707, of around $10^{16}$ cm$^{-3}$ in impurity concentration and around a few μm in depth.

On the p−− type semiconductor region 704 an n+ type semiconductor region 706 is selectively formed at a distance from boundaries between the regions 704 and 705. The n+ type semiconductor region 706 may be for example, on its surface, of around $10^{19}$ cm$^{-3}$ in impurity concentration and around 0.3 μm in depth. On the surface of the p type semiconductor regions 705 n+ type semiconductor regions 707 are selectively formed at a distance from the boundaries between the regions 704 and 705. The n+ semiconductor regions 707 may be for example, on its surface, of around $10^{19}$ cm$^{-3}$ in impurity concentration and around 0.3 μm in depth. Surface portions of the p−− type semiconductor region 704 and the p type semiconductor regions 705 between the n+ type semiconductor regions 706 and 707 are defined as channel regions 708, On the channel regions 708 gate electrodes 710 is formed through gate oxidation films 709. Besides on the p type semiconductor regions 705 and the n+ type semiconductor regions 707 a common cathode electrode 711 is formed. These electrodes 710 and 711 are insulated by an insulation film 712. On the back of the p+ type semiconductor substrate 701 an anode electrode 713 is formed.

Figure 10:
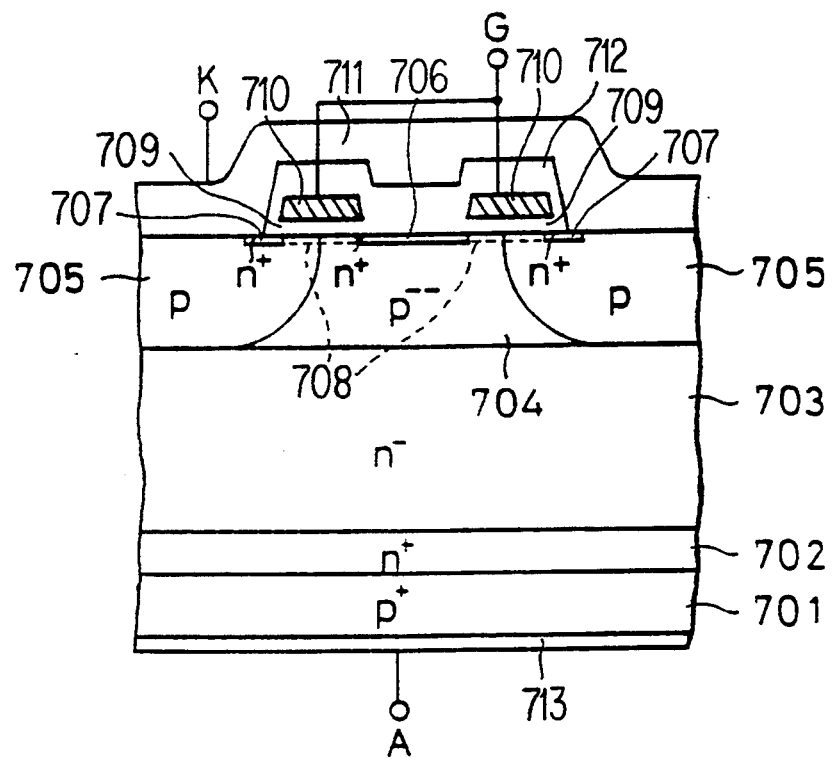
FIG. 10 and 11 are cross-sectional views showing another embodiment of the semiconductor device according to the present invention.
Figure 11:
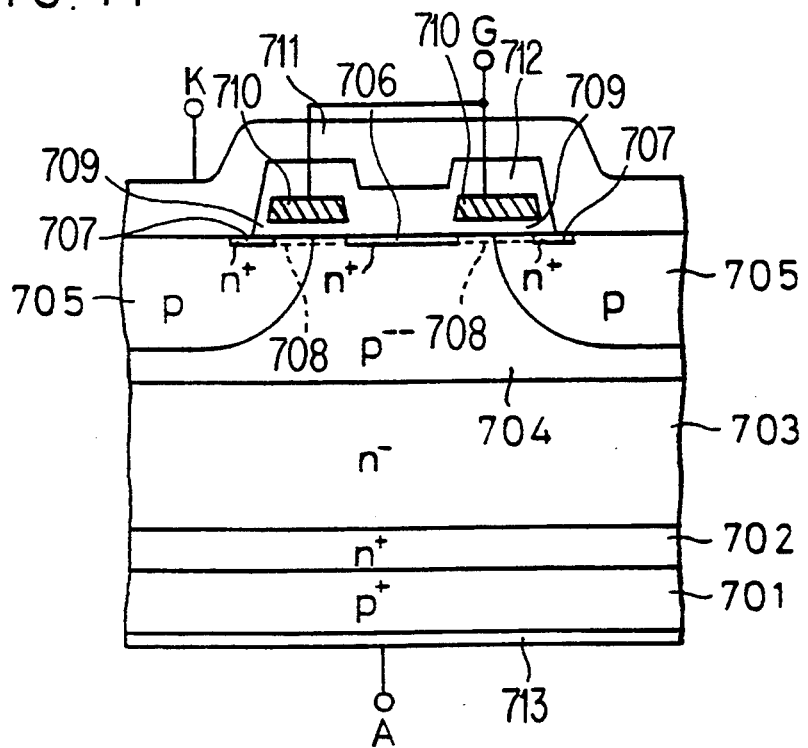

Hereupon though as shown in FIG. 8 the p−− type semiconductor layer 704 is less in depth than the p type semiconductor regions 705, it may be around the same in depth as the p type semiconductor regions 705 as shown in FIG. 10 or Greater in depth than the p type semiconductor regions 705 as shown in FIG. 11.

In an equivalent circuit in FIG. 9, an n channel MOSFET 801 corresponds to the MOSFET with MOS structure above the p−− type semiconductor region 704 in FIG. 8. A pnp transistor 802 of a multicollector to a bipolar transistor with p−n−n−p−− structure composed of the p+ type semiconductor substrate 701, the n+ type semiconductor layer 702, the n− type drift layer 703 and the p−− type semiconductor region 704 in FIG. 8 and corresponds to a bipolar transistor with p+n+n−p structure which is formed by replacing the collector of this bipolar transistor from the p−− type semiconductor region 704 to the p type semiconductor region 705. An npn transistor 803 corresponds to a bipolar transistor with n−p−−n+ structure composed of the n− type drift layer 703, the p−− type semiconductor region 704 and the n+ type semiconductor region 706 in FIG. 8. A resistor 804 expresses a resistance component in the p−− semiconductor region 704.

A part of the transistor 802 and the transistor 803 are thyristor-connected to compose a thyristor portion. To this thyristor portion the MOSFET 801 is cascade-connected. Thus, in this semiconductor device, cascade-drive of a GTO thyristor by the MOSFET is implemented.

Figure 12:
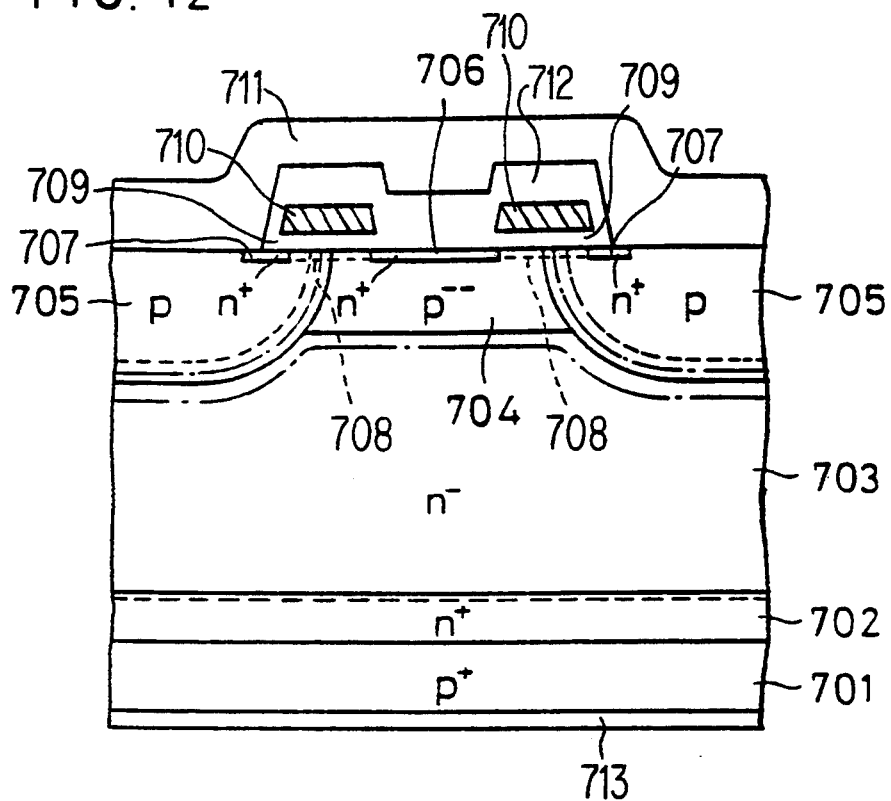
FIG. 12 and 13 show extension manners of a depletion layer.

Operation will now be explained. When application voltage on an anode terminal A is raised with respect to a cathode terminal K while the MOSFET 801 is turned off due to low gate voltage applied to a gate terminal G, a pn junction between the n− type drift layer 703 and the p−− and p type semiconductor region 704 and 705 is reversely biased and a depletion layer starts to extend at the both sides of this pn junction. The depletion layer extends well within the p−− type semiconductor region 704 which is low in accepter density and the p−− type semiconductor region 704 is completely depleted by the anode voltage of a few V. When the anode voltage is further raised, the p type semiconductor region 705 which is high in the accepter density is a little depleted and extension of the depletion layer stops. Condition of extension of the depletion layer (an edge of the depletion layer) upon low voltage blocking are shown in FIG. 12 by a chain line. Upon this the edge of the depletion layer appears also around the n+ type semiconductor region 706, but the illustration is omitted in the drawings.

The depletion layer extending to the side of the n− type drift layer 703 completely depletes the n− type drift layer 703 by application of anode voltage of a few hundred V, and when the anode voltage is elevated up to the rated voltage (for example 1,000 V), extension of the depletion layer stops after depleting a little the n+ type semiconductor layer 702 which is high in donor density. Conditions of extension of the depletion layer upon high voltage blocking are shown in FIG. 12 by a dotted line. As the anode voltage is increasingly raised beyond the rated voltage, an electric field within the semiconductor device reaches in the due course a critical electric field so that breakdown starts.

Figure 13:
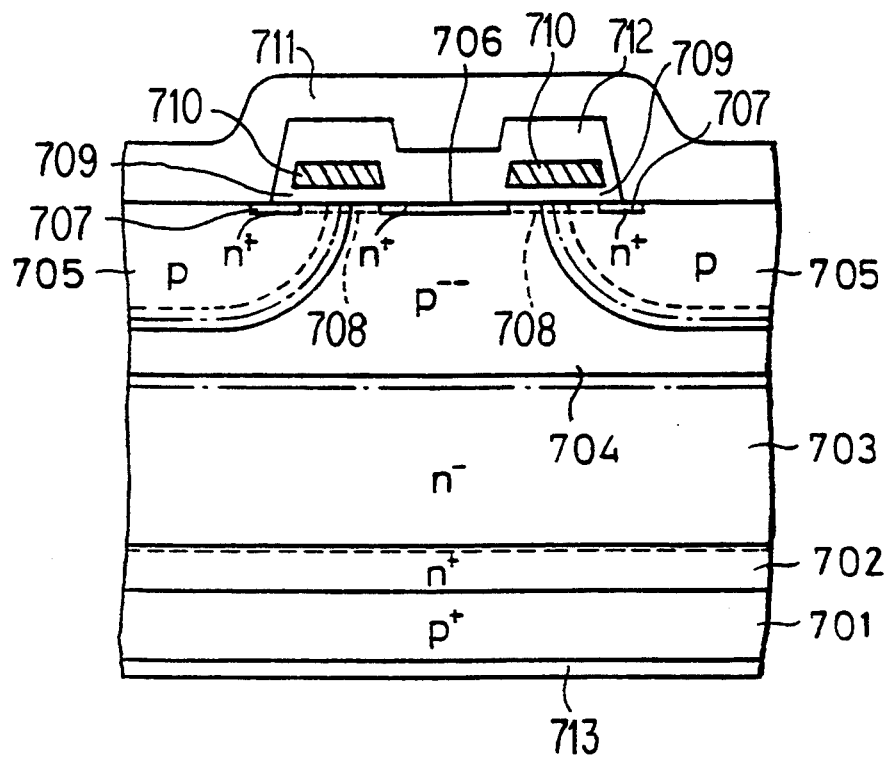

FIG. 13 shows extension of the depletion layer at a voltage blocking state in the semiconductor device of the structure shown in FIG. 11. As in the FIG. 12, a chain line shows extension of the depletion layer upon low voltage blocking and a dotted line shows one upon high voltage blocking. In the case of the structure shown in FIG. 11, since a pn junction between the n− type drift layer 703 and the p−− semiconductor region 704 becomes flat one with no curvature, concentration of the electric field is difficult to arise so that high breakdown voltage is easily obtained. This is true also for the semiconductor device of the structure shown in FIG. 10.

When positive voltage is applied to the gate terminal G, inverted layers are formed in the channel regions 708 and the MOSFET 801 becomes an on state. Threshold voltage for the channel regions 708 to be turned on is determined by the impurity concentration of the p type semiconductor regions 705 at the edges of the channel regions 708 on the side of the n+ type semiconductor regions 707. This impurity concentration is set so that the above threshold voltage takes appropriate value in an enhancement mode.

When the MOSFET 801 is turned on, the n+ type semiconductor 706 becomes around the same electric potential level as the cathode electrode 711. When under these conditions application voltage on the anode terminal A is increased with respect to the cathode terminal K, the pn junction between the n− type drift layer 703 and the p−− and p type semiconductor regions 704 and 705 is reversely biased so that, in the same way as mentioned before, the depletion layer expands to the both sides of the pn 3unction and the p−− type semiconductor region 704 is completely depleted by the anode voltage of a few V. Thus the base region of the npn transistor 803 composed of the n− type drift layer 703, the p−− type semiconductor region 704 and the n+ type semiconductor region 706 is punched through and the collector of the transistor 803 is electrically connected with the emitter thereof with low impedance (i.e., the transistor 803 is turned on). In this way electrons are injected from the n+ type semiconductor regions 707 to the n− type drift layer 703 (the base of the pnp transistor 802) through the channel regions 708, the n+ type semiconductor region 706 and the punched-through p−− type semiconductor region 704, and in response to this holes are injected from the p+ type semiconductor substrate 701 (the emitter of the pnp transistor 802) to the n− drift layer 703 through the n+ type semiconductor layer at the resistance 804 upon flowing from the p−− type semiconductor region 704 to the cathode electrode 711 through the p type semiconductor regions 705, and are supplied as base current of the npn transistor 803 so that the transistors 802 and 803 are thyristor-operated and latched.

Thus, this semiconductor device is turned on and the anode current flows from the anode terminal A toward the cathode terminal K. In the ON state the thyristor composed of the transistors 802 and 803 works to greatly reduce the voltage drop at series resistance by the MOSFET 801. In addition the pnp transistor (a part of the transistor 802) composed of the p+ type semiconductor substrate 701, the n+ type semiconductor layer 702, the n− type drift layer 703 and the p type semiconductor regions 705 also becomes active to flow the anode current.

As mentioned above, in the ON state of the semiconductor device according to this embodiment since the current conduction capability of the MOSFET 801 is greatly improved, even if the amplification factor of the pnp transistor 802 is decreased due to introduction of a life time killer, etc., increase of current density (decrease of ON state voltage) can be implemented.

In the ON state where the anode current flows between the anode and cathode terminals A and K, when the channel region 708 is cut off (i.e., the MOSFET 801 is turned off) by eliminating positive voltage of the gate terminal G, the emitter of the npn transistor 803 is made free. Thus, the thyristor composed of the transistors 802 and 803 is unlatched. Electrons as minority carriers within the p−− type semiconductor region 704 and holes as minority carriers within the n− type drift layer 703 disappear by recombination and turn-off of this semiconductor device is finished. As regards disappearance of the minority carriers, that of the holes takes longer time, so that this semiconductor device shows basically the same cut-off characteristics as the IGBT.

Upon turn-off of the MOSGTO and MCT since bypass through a MOS channel was made between a gate and a cathode of a GTO thyristor to unlatch the thyristor, it was difficult to take enough high blockable main current density. On the other hand in the semiconductor device of the above embodiment, since it takes structure to close/open the cathode of the GTO thyristor through the MOS channel, so that there are advantages that the main current up to the limit of current flowing ability of the MOS channel can flow and be cut off. Besides since only one Gate terminal is necessary for ON/OFF control, mounting density of the device is increased so that high current density can be realized. Furthermore owing to existence of the p−− type semiconductor region 704, concentration of electric field due to curved edges of the p type semiconductor regions 705 is relaxed (especially in structures shown in FIGS. 10 and 11). Accordingly as not only diffusion depth of the p type semiconductor region 705 can be made smaller but also channel length of the channel regions 708 can be made shorter, fine MOS structure can be produced so that reduction of ON state resistance and increase of current density can be realized still more.

Figure 14:
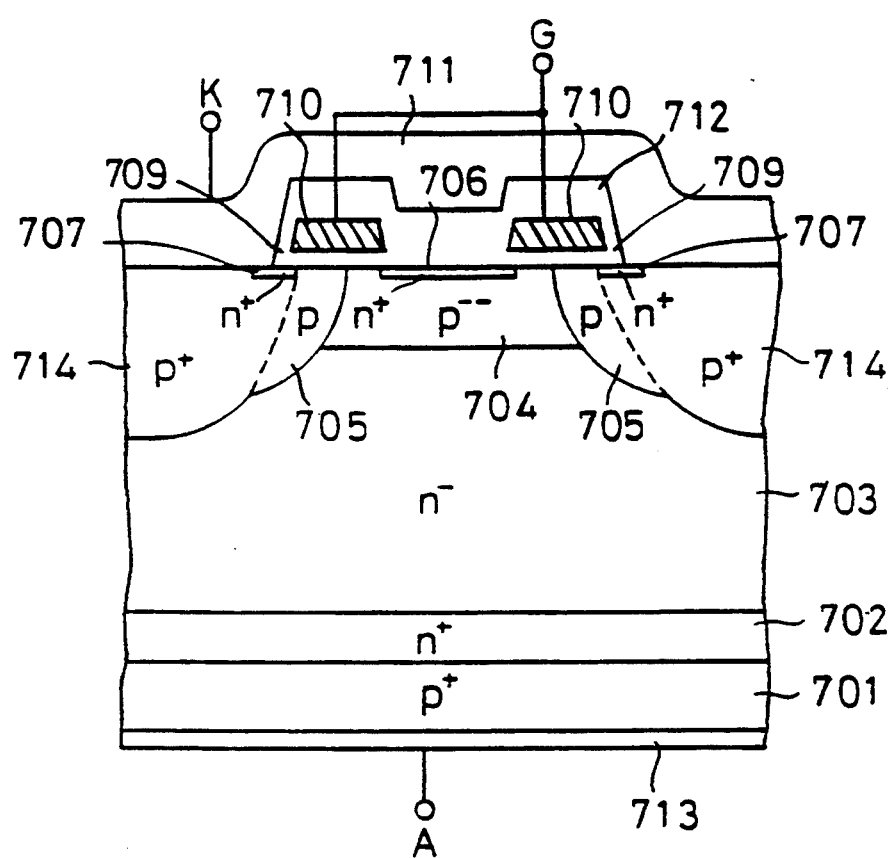
FIG. 14 is a cross-sectional view showing still another embodiment of the semiconductor device according to the present invention.

Hereupon the semiconductor device according to the above embodiment, like the IGBT, is also with a built-in parasitic thyristor composed of the p+ type semiconductor substrate 701, the n+ type semiconductor layer 702, the n− type drift layer 703, the p type semiconductor regions 705 and the n+ type semiconductor regions 707. Accordingly when the current density within the p type semiconductor regions 705 is raised, this parasitic thyristor latches up so that there is possibility of becoming noncontrollable. Therefore in order to prevent rise of potential within the p type semiconductor regions 705, as shown for example in FIG. 14, it is preferable to provide the p type semiconductor regions 705 with high concentration diffusion regions 714 to keep low the resistivity of the p type semiconductor regions 705.

Figure 15A:
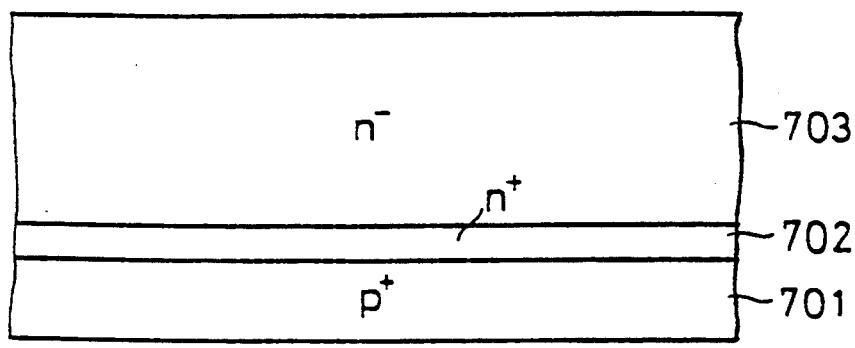
FIGS. 15A through 15E are cross-sectional views showing fabricating steps of the semiconductor device in FIG. 8.
Figure 15B:
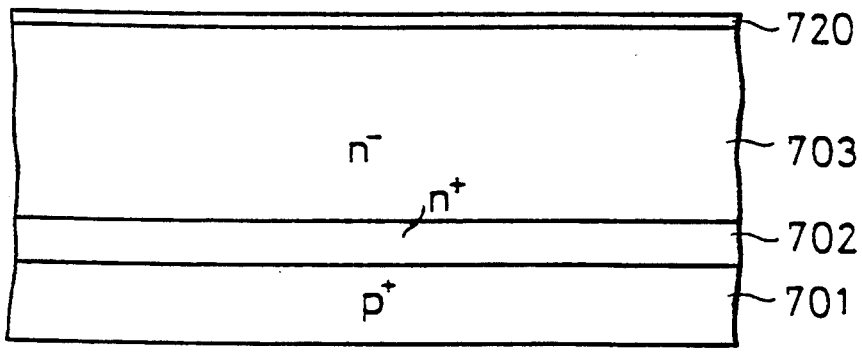
Figure 15C:
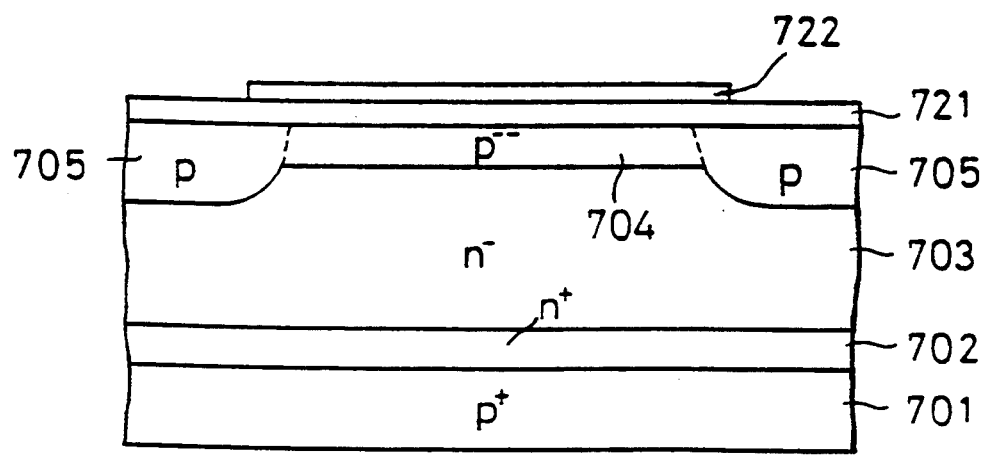

Now in reference to FIGS. 15A through 15E, a fabrication method of the semiconductor device shown in FIG. 8 will be explained. To begin with as shown in FIG. 15A, on the p+ type semiconductor substrate 701 n type impurities are ion-implanted to form the n+ semiconductor layer 702, and then the n− type semiconductor layer 703 is formed thereon by epitaxial growth. In the next as shown in FIG. 15B, on the whole surface of the n− semiconductor substrate 703 p type impurities are implanted to form the p− semiconductor layer 720. Then as shown in FIG. 15C, after a silicon oxidation film 721 is formed on the whole surface by oxidation, poly-silicon is deposited on the surface and then patterned by selective etching to form a poly-silicon film 722. After that, p type impurities are ion-implanted with the poly-silicon film 722 used as a mask and annealed to form the well-like p type semiconductor region 705. On the occasion the p−− type semiconductor region 704 is at the same time formed owing to diffusion of the p type impurities of p− type semiconductor layer 720.

Figure 15D:
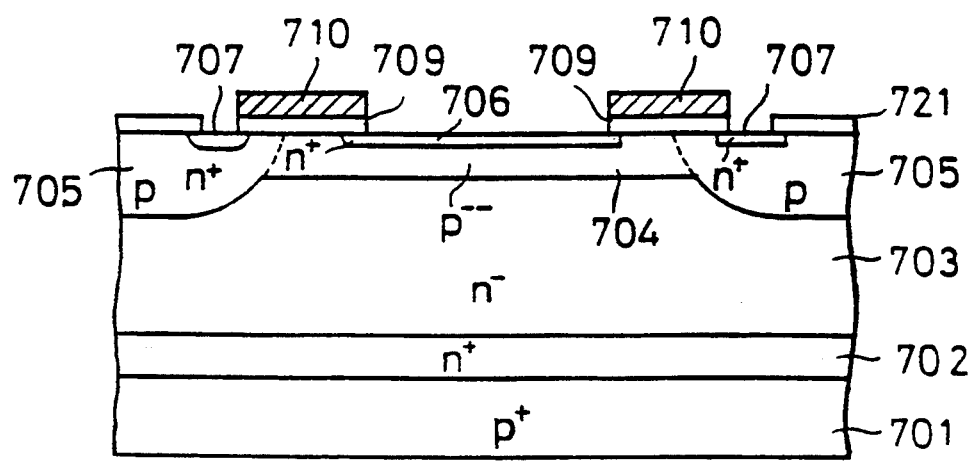
Figure 15E:
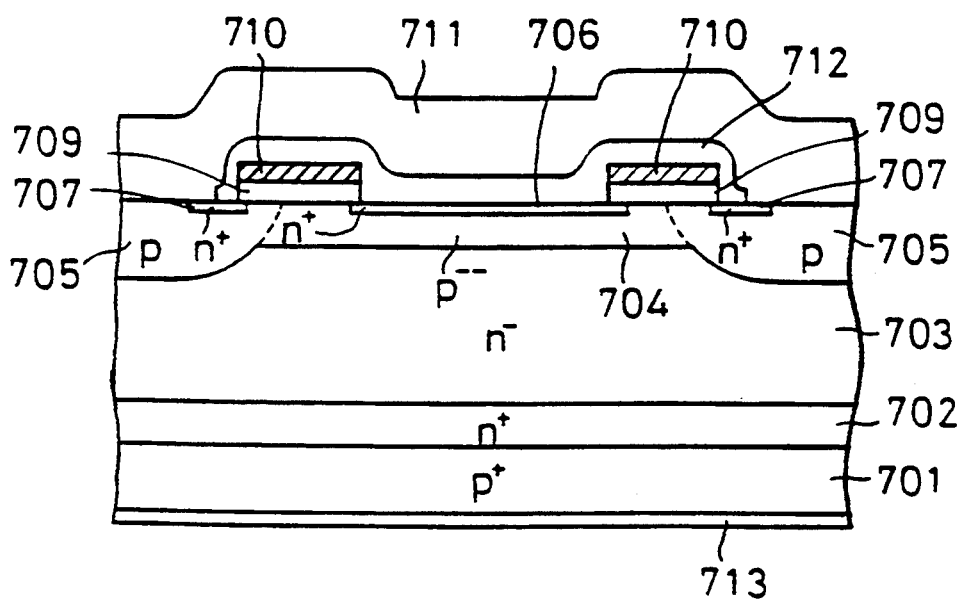

Nextly as shown in FIG. 15D, selective etching of the poly-silicon film 722 and the oxidation film 721 is carried out to form the gate electrodes 710 and the gate oxidation films 709 and also windows are provided at the both sides thereof. Then n type impurities are selectively introduced through the windows to form the n+ type semiconductor regions 706 and 707 in a self-alignment manner. Then as shown in FIG. 15E, the gate electrodes 710 and the n+ type semiconductor region 706 are covered by an interlayer insulation film 712, and metalization treatment is carried out to form the cathode electrode 711 on the top surface and the anode electrodes 713 on the back. Thus the semiconductor device with the structure shown in FIG. 8 is implanted.

Figure 16:
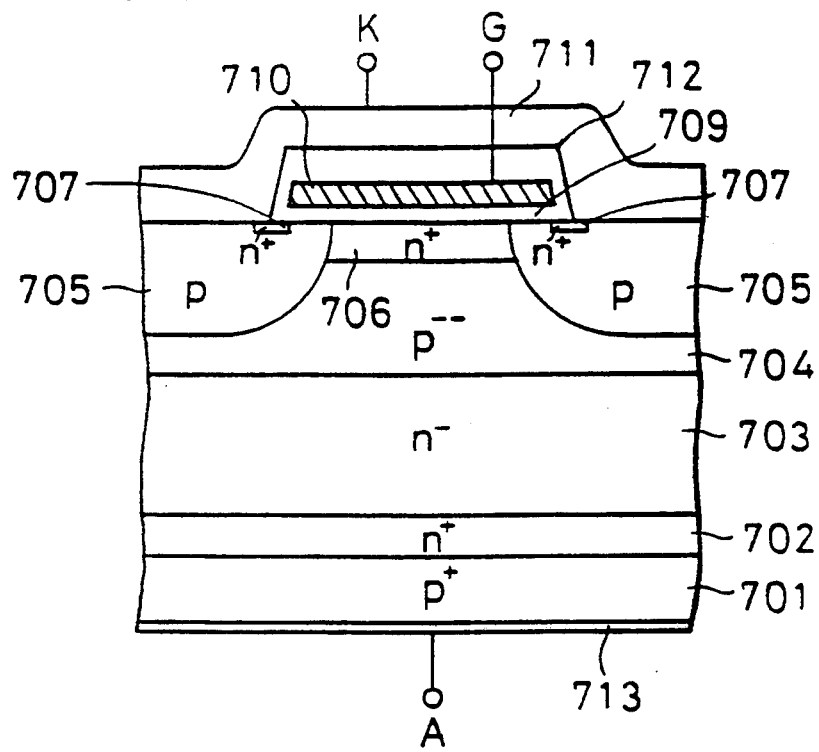
FIGS. 16 and 17 are cross-sectional views showing still another embodiment of the semiconductor device according to the present invention.

FIG. 16 is a cross-sectional view showing another embodiment of the semiconductor device according to the present invention. In this embodiment, the n+ type semiconductor region 706 is formed not on a part but on the whole of the surface of the p$^{--}$ type semiconductor region 704. In addition the gate electrode 710 is not divided into two parts, instead a single common gate electrode is provided between the two channel portions. Other structures are the same effects as those of the above embodiment can be obtained.

Figure 17:
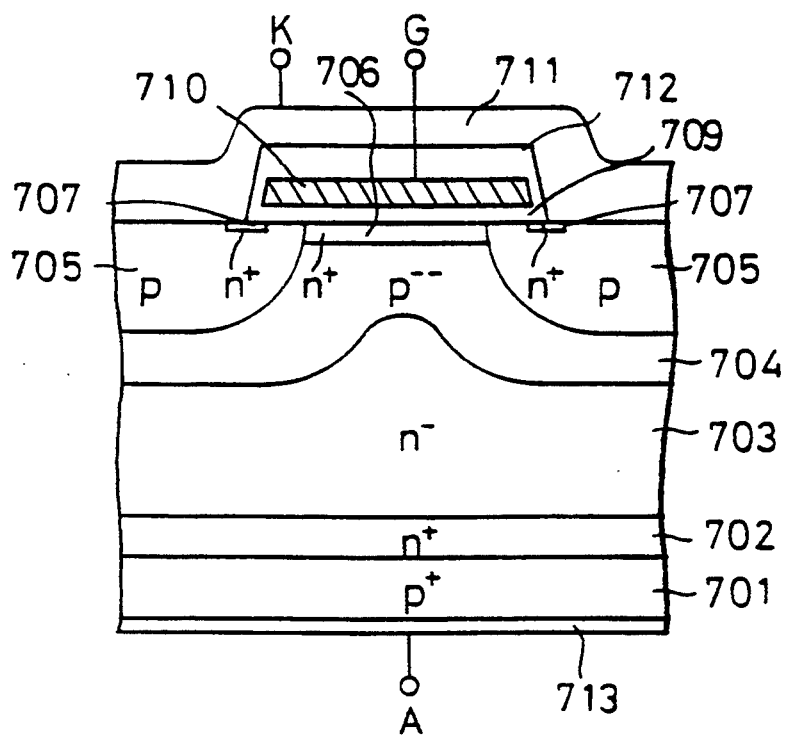

Besides the bottom configuration of the p$^{--}$ semiconductor region 704 need not necessarily be flat, and for example in as shown in FIG. 17 it may be one along well configurations of the p type semiconductor regions 705.

Figure 18A:
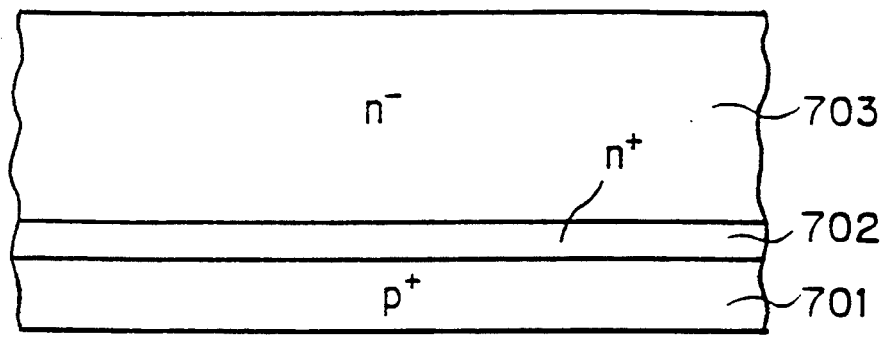
FIGS. 18A–18J are cross sectional views showing fabrication steps of the semiconductor device in FIG. 11.
Figure 18B:
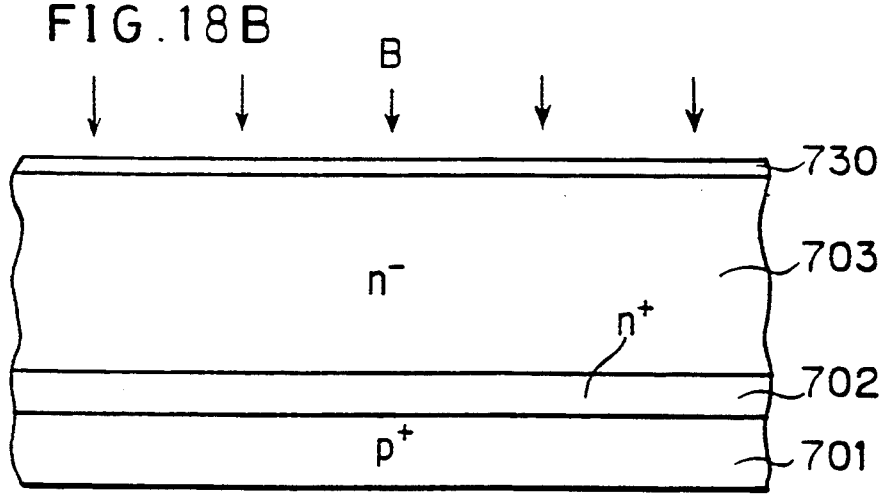
Figure 18C:
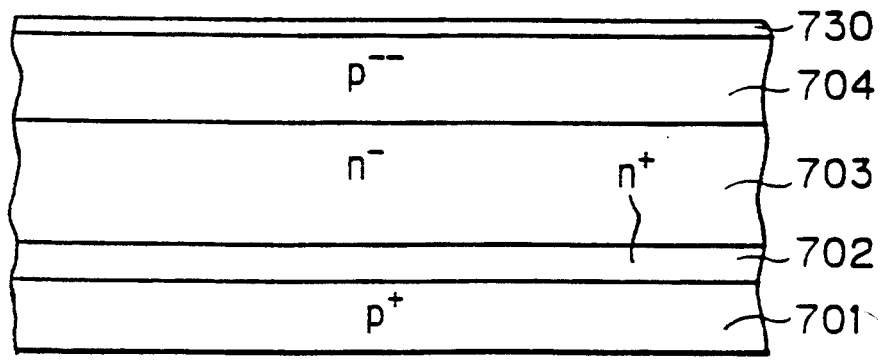

With reference to FIGS. 18A to 18J, a preferred embodiment of the method of fabricating the semiconductor device of FIG. 11 is described below. First, as shown in FIG. 18A, n type impurity ions are injected on the surface of a p+ type semiconductor substrate 701 to form an n+ type semiconductor layer 702 on the substrate 701. On the n+ type semiconductor layer 702, an n$^-$ type drift layer 703 is epitaxially grown. As shown in FIG. 18B, the surface of the n$^-$ type drift layer 703 is thermally oxidized to form an oxide film 730, and subsequently p type impurity ions such as boron are injected thereon. Heat treatment is performed to diffuse the p type impurities, and thereby a p$^{--}$ type semiconductor region 704 is formed as shown in FIG. 18C.

Figure 18D:
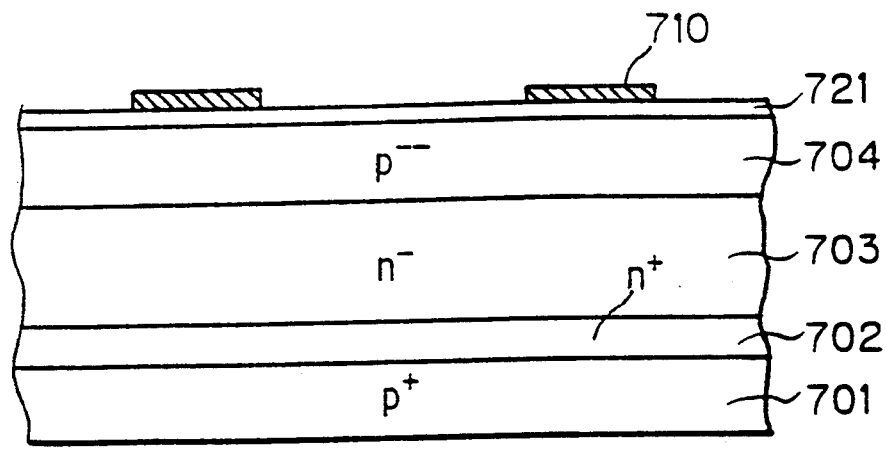
Figure 18E:
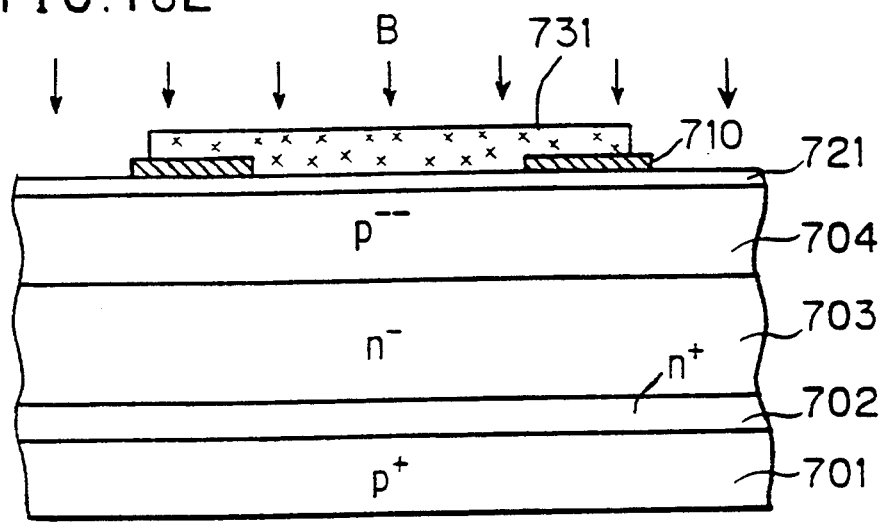
Figure 18F:
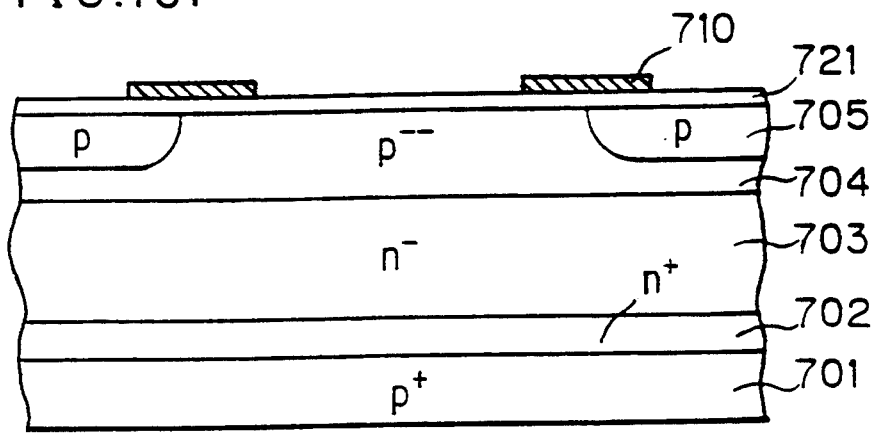

As shown in FIG. 18D, after the removal of the oxide film 730 on the top surface, a silicon oxide film 721 for a Gate insulation film is substituted for the oxide film 730. On the silicon oxide film 721 is formed a polysilicon film. The polysilicon film is selectively removed by photolithography, thereby polysilicon gate electrodes 710 being formed. Next, as shown in FIG. 18E, resist material is formed all over the top surface and selectively removed by photolithography to leave a resist 731. Using the resist 731 as a mask, the top surface is injected with p type impurity ions such as boron. As shown in FIG. 18F, the resist 731 is thereafter removed, and heat treatment is performed to diffuse the p type impurities, thereby well-like p type semiconductor regions 705 being formed.

Figure 18G:
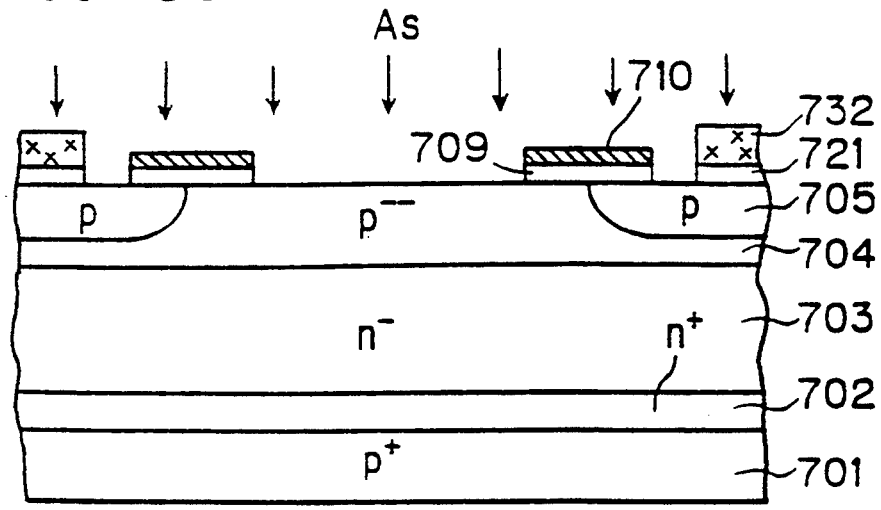

Next, as shown in FIG. 18G, resist material is formed all over the top surface and selectively removed by photolithography to leave resists 732. Using the resists 732 and the polysilicon gate electrodes 710 as masks, the oxide film 721 is selectively etched away. The oxide films 721 which remain below the gate electrodes 710 become gate oxide films 709. Subsequently, using the gate electrodes 710 and the resists 732 as masks, the top surface is injected with n type impurity ions such as arsenic.

Figure 18H:
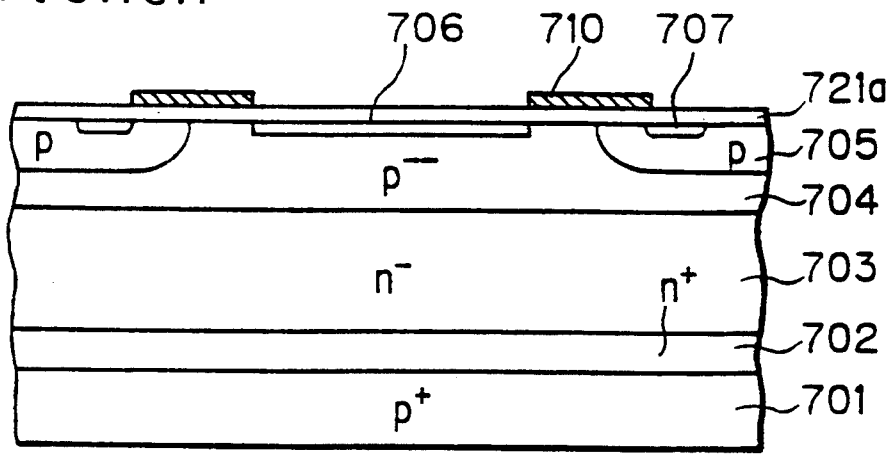
Figure 18I:
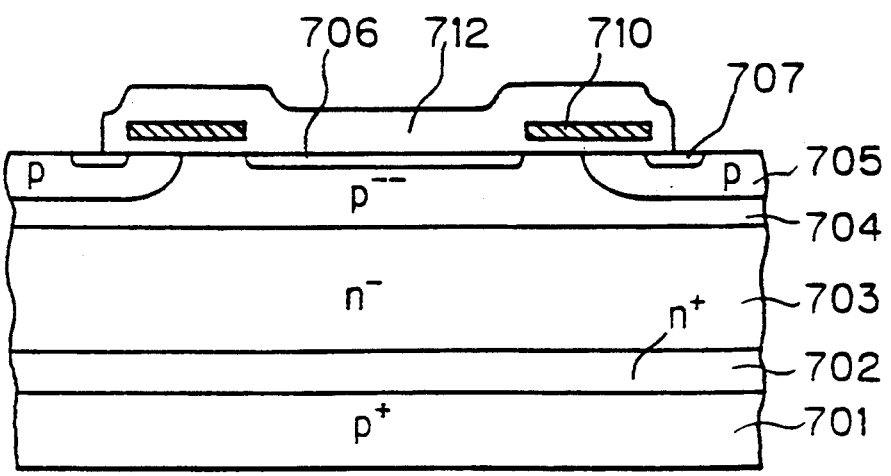
Figure 18J:
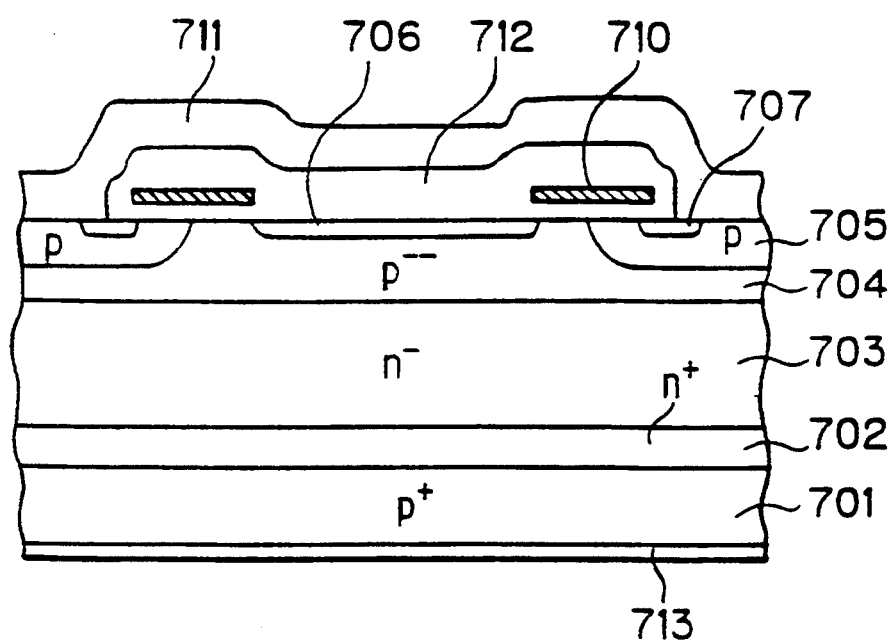

With reference to FIG. 18H, heat treatment is performed to diffuse the n type impurities, thereby n+ type semiconductor regions 706 and 707 being formed. The exposed surfaces of the p$^{--}$ type semiconductor region 704 and the p type semiconductor regions 705 are thermally oxidized, and thereby the gate oxide films 709 and the oxide films 721 are again linked together to form an oxide film 721a. As shown in FIG. 18I, the gate electrodes 710 are coated with a layer insulation film 712, which is patterned. On the layer insulation film 712 is formed a cathode electrode 711, for example, made of Al by metalization treatment. On the back surface is formed an anode electrode 713 including, for example, a three-layer structure of Ti-Ni-Au by metalization treatment. Thereby, a semiconductor device having the same structure as FIG. 11 is provided as shown in FIG. 18J.

According to this preferred embodiment, after the polysilicon Gate electrodes 710 is formed, the p type semiconductor regions 705 and the n+ type semiconductor regions 706 and 707 are formed in a self-alignment manner, using the polysilicon Gate electrodes 710 as masks in common. Therefore, lateral positional deviations between these regions 705, 706 and 707 are extremely reduced. An advantage is that required characteristics as designed can be correctly achieved.

Figure 19A:
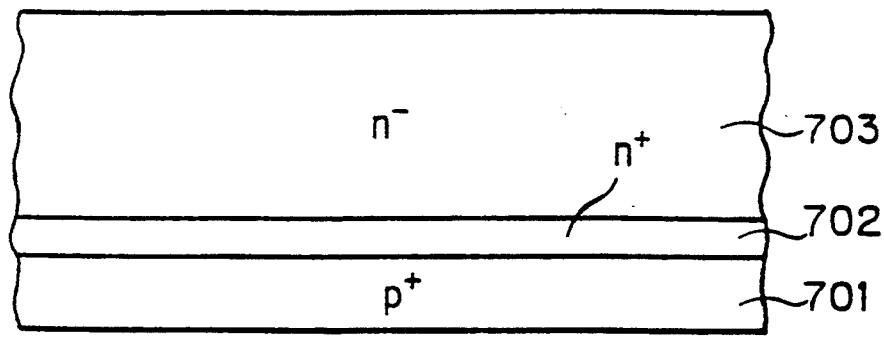
FIGS. 19A–19K are cross-sectional views showing other fabrication steps of the semiconductor device in FIG. 11.
Figure 19B:
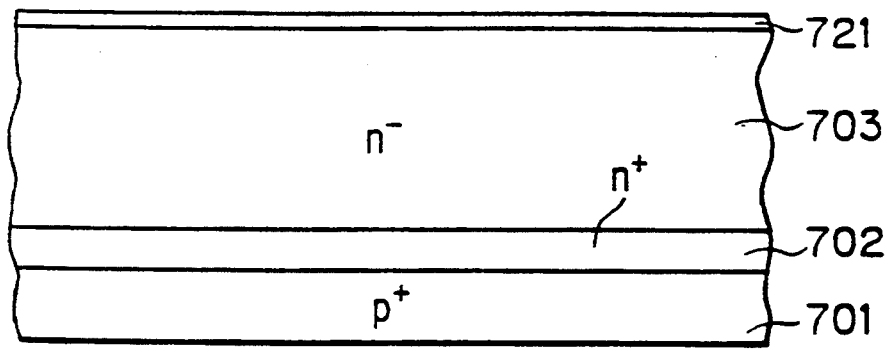
Figure 19C:
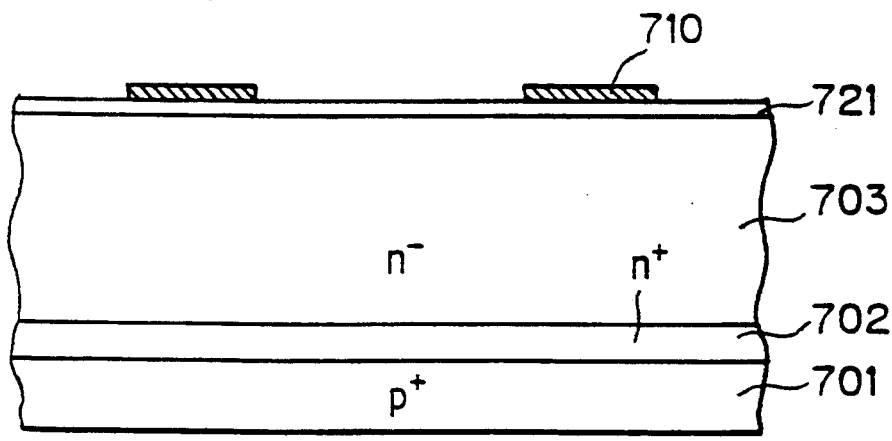
Figure 19D:
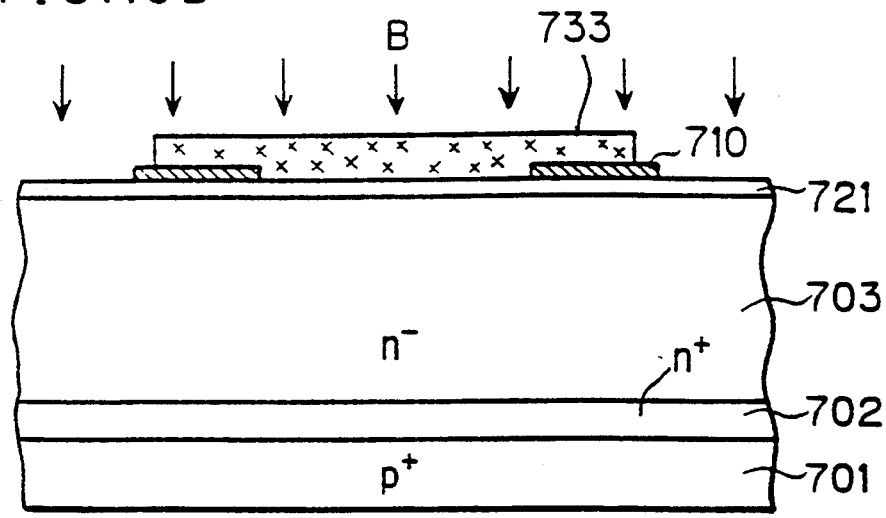
Figure 19E:
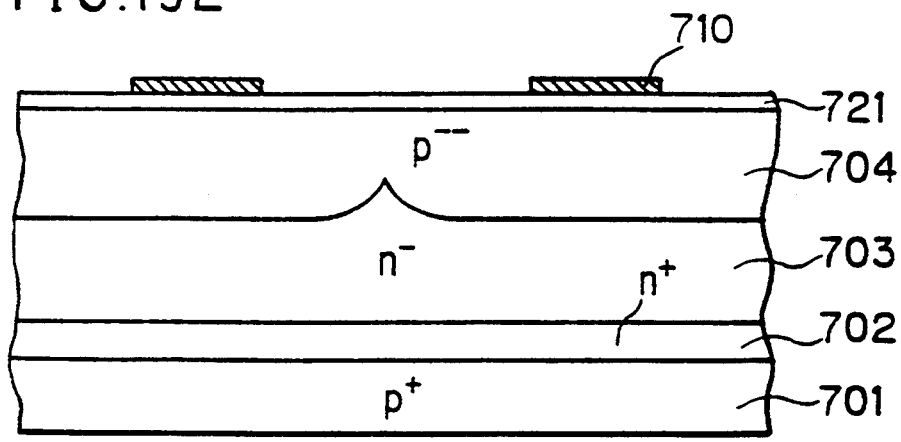
Figure 19F:
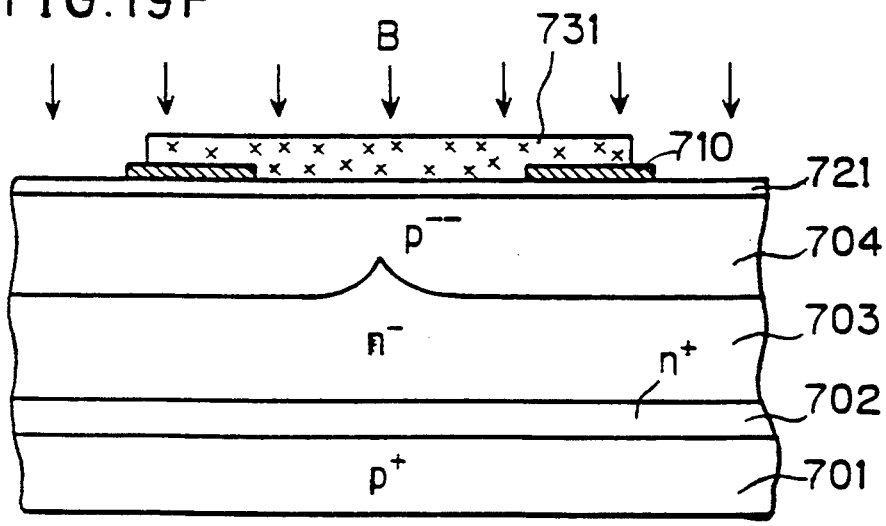
Figure 19G:
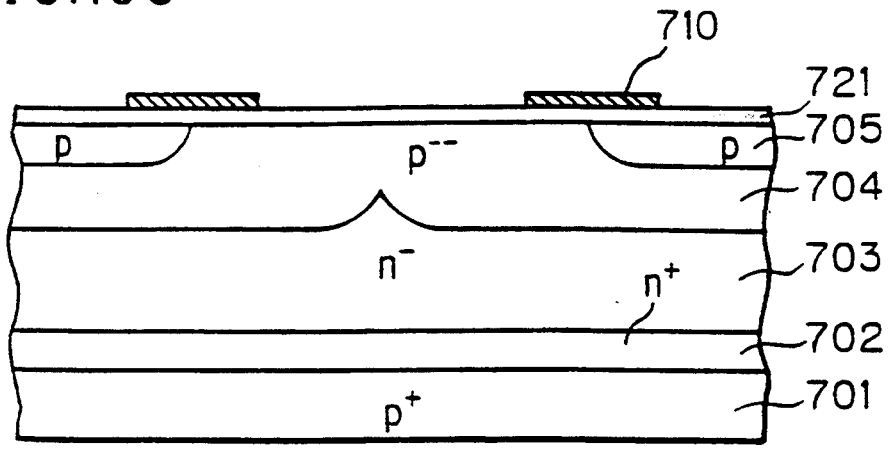
Figure 19H:
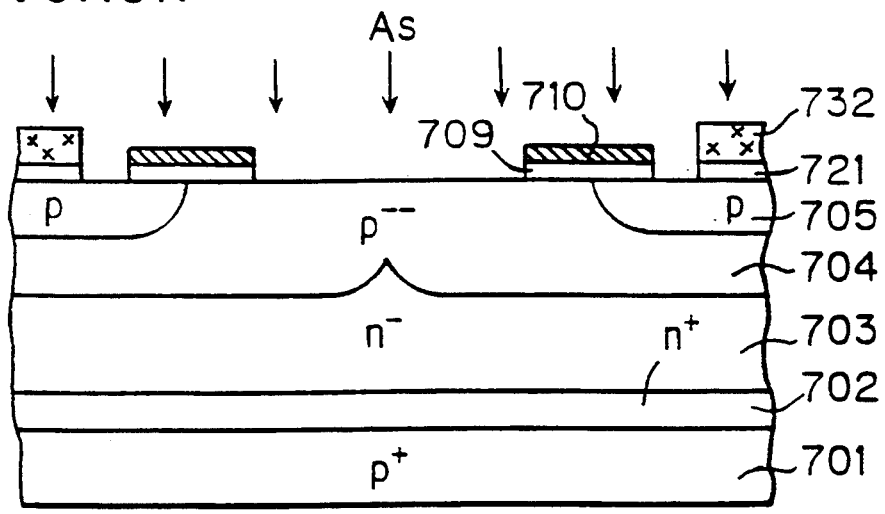
Figure 19I:
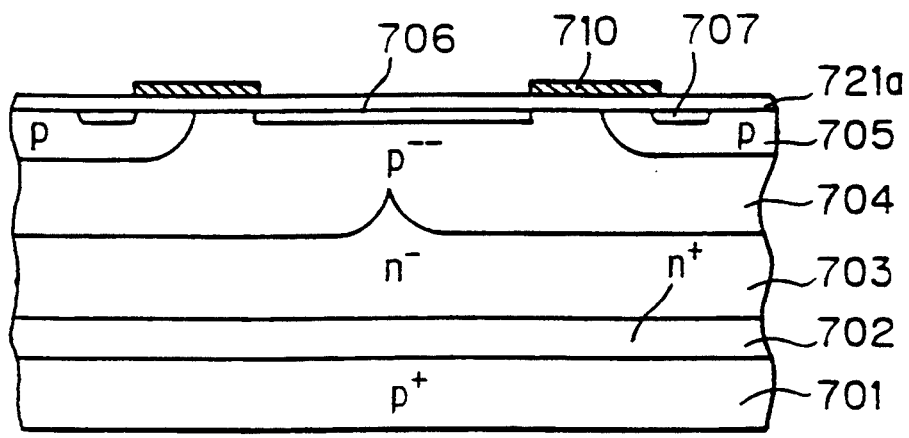
Figure 19J:
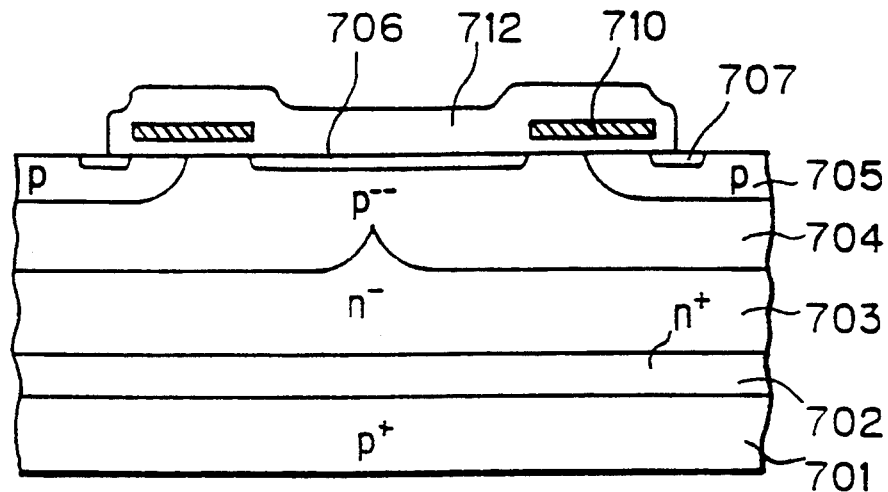
Figure 19K:
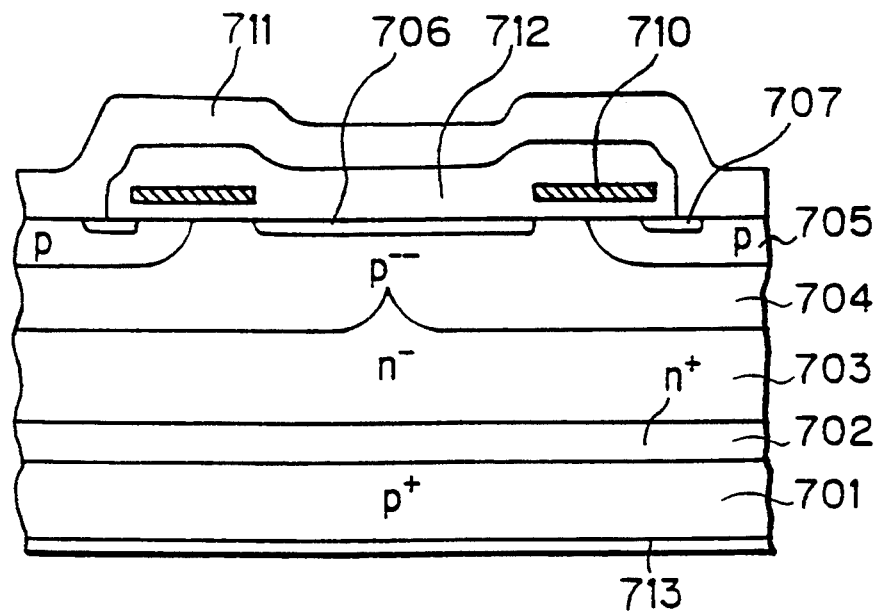

FIGS. 19A to 19K are cross-sectional views of another preferred embodiment of the method of fabricating the semiconductor device of FIG. 11. The step of FIG. 19A is similar to that of FIG. 18A. Next, as shown in FIG. 19B, a silicon oxide film 721 for a Gate insulation film is formed on the n$^-$ type drift layer 703. On the silicon oxide film 721 are formed polysilicon Gate electrodes 710, as shown in FIG. 19C. As shown in FIG. 19D, a resist 733 is formed on the top surface, which is then injected with p type impurity ions such as boron. As shown in FIG. 19E, after the removal of the resist 733, heat treatment is performed to diffuse the p type impurities, thereby a p$^{--}$ type semiconductor region 704 being formed. The structure of FIG. 19E obtained in this manner is equivalent to that of FIG. 18D of the previous preferred embodiment.

The steps of FIGS. 19F to 19K are entirely similar to those of FIGS. 18E to 18J of the previous fabricating method, and hence the description thereof is omitted. The resist 733 may be left unremoved in the step of FIG. 19E and used as the resist 731 in the step of FIG. 19F. The resist 733 in the step of FIG. 19D is not necessarily provided.

The difference between the method according to this preferred embodiment and the method according to the previous preferred embodiment is that this method forms the p$^{--}$ type semiconductor region 704 and the p type semiconductor regions 705 by injecting the p type impurity ions by means of the same mask.

In the respective preferred embodiments, the p$^{--}$ type semiconductor region 704 is selected to be $1 \times 10^{15}$ cm$^3$ or less in surface impurity concentration, and more preferably $5 \times 10^{13}$ cm$^{-3}$ or less. The p$^{--}$ type semiconductor region 704, in the vicinity of the interface between the bottom of the p type semiconductor regions 705 and the p$^{--}$ type semiconductor region 704, is preferably selected to be $1 \times 10^{14}$ cm$^{-3}$ or less in impurity concentration.

In the respective preferred embodiments is described the formation of the p$^{--}$ type semiconductor region 704 by the diffusion of the p type impurities such as boron. The present invention is not limited to this. For example, the p⁻⁻ type semiconductor region 704 can be formed also by the diffusion of heavy metal. To achieve $5 \times 10^{13}$ cm$^{-3}$ or less in the surface impurity concentration of the p⁻⁻ type semiconductor region 704, a predetermined amount of heavy metal such as platinum and gold is diffused which can counterbalance the donor density of the n⁻ type drift layer 703 and have the surface acceptor density of around $1 \times 10^{13}$ cm$^{-3}$. Thereby the high resistive p⁻⁻ type semiconductor region 704 can be provided. The heavy metal such as platinum and gold has high diffusion coefficient, compared with the p type impurities such as boron and thereby is advantageous in that the p⁻⁻ type semiconductor region 704 can be fabricated for a short time.

Though an n channel type semiconductor device has been explained in the above embodiments, the present invention can be of course applied to a p channel type semiconductor device by inverting conductivity types of respective layers and regions.

The semiconductor device mentioned above according to the present invention exhibits excellent performance when applied to a flash control device used as an auxiliary light source such as for photographing. In the following a flash control device using a semiconductor device according to the present invention will be described in detail after a conventional flash control device using an IGBT and its problems will be explained in advance.

Figure 20:
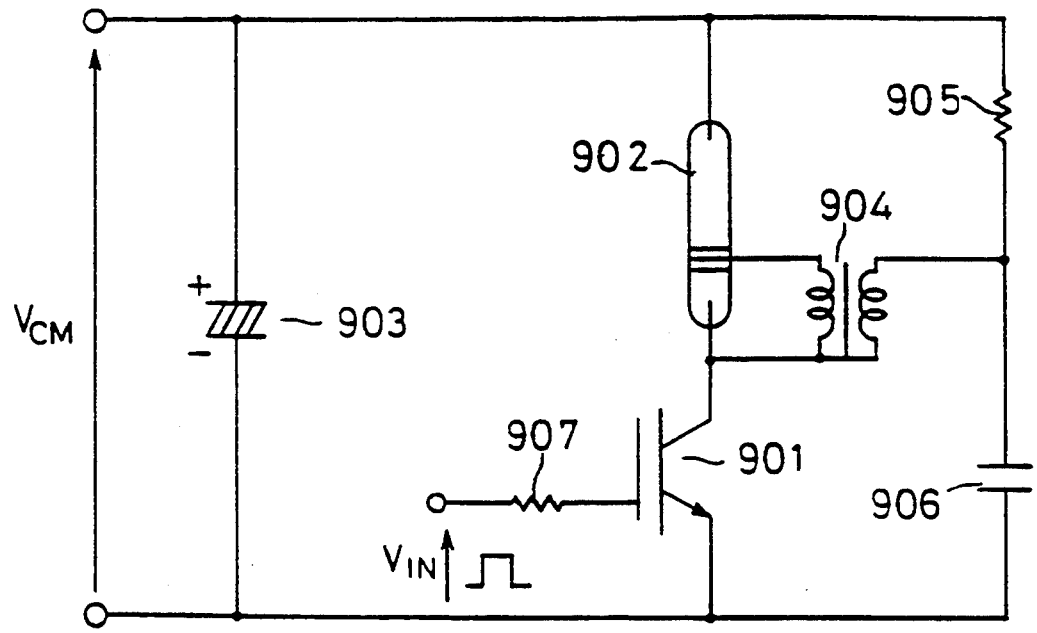
FIGS. 20 and 21 are circuit diagrams showing a conventional flash control device.

FIG. 20 is a circuit diagram showing a conventional flash control device using an IGBT. In FIG. 20, a series connection of an IGBT 901 and a flash discharge tube 902 are in parallel connected with a condenser 903 for flash energy accumulation to compose a main circuit. A high voltage electric source $V_{CM}$ is applied to the main circuit. A trigger circuit for trigging the flash discharge tube 902 is composed of a trigger transducer 904, a resistor 905 and a trigger condenser 906. Through a gate resistor 907 control input VIN is applied to the gate of the IGBT 901.

In the operation, the control input VIN applied to the gate of the IGBT 901 is made in low level to turn off the IGBT 901 to charge the condenser 903 for flash energy accumulation with polarity illustrated (normally 300 V or so) by the high voltage electric source VCM. At the same time, the trigger condenser 906 is charged through the resistor 905. Under these conditions when the control input VIN of a high leveled (ordinarily some ten V) voltage pulse is applied to the gate of the IGBT 901, the IGBT is turned on, so that charges in the trigger condenser 906 are discharged through a primary coil of the trigger transducer 904. Owing to this high voltage pulse of some KV generates in a secondary coil of the trigger transeducer 904 so as to trigger the flash discharge tube 902. In response to this, the flash discharge tube 902 starts to discharge to emit flash with consuming charges accumulated in the condenser 903 for flash energy accumulation. At the moment luminous energy necessary for photographing has been obtained, the gate voltage of the IGBT 901 is lowered enough to low level to turn the IGBT 901 off. Thus current flowing through the flash discharge tube 902 is cut off to stop flash discharges. At the same time, the trigger condenser 906 is recharged to the original polarity returning to the initial state.

As mentioned above in the conventional flash control device, by using the IGBT as a switching element, energy charged in the condenser 903 for flash energy accumulation is applied to the flash discharge tube 902 for desired time to control flash energy. The IGBT is a semiconductor device formed by integrated on a chip a bipolar transistor driven by the MOSFET, so that it can be voltage-driven as the MOSFET and has current flowing ability equal to the bipolar transistor. However since the output stage of the IGBT is formed by a bipolar transistor, its current flowing ability is restricted by (current flowing ability of the MOSFET)×($h_{FE}$ of the bipolar transistor), and hence a large silicon chip of around 5–7 mm is needed to transfer or cut off large current pulse such as 100–200 A required for the flash control device. As a result the conventional flash control device using the IGBT is presently not put to wide use because of comparatively high price. In addition because it is used at high current density, on state voltage drop through the IGBT is high such as 6–10 V to lower flashing efficiency and a package of an integrated circuit including the IGBT becomes large so that the flash control device can not be made small.

Figure 21:
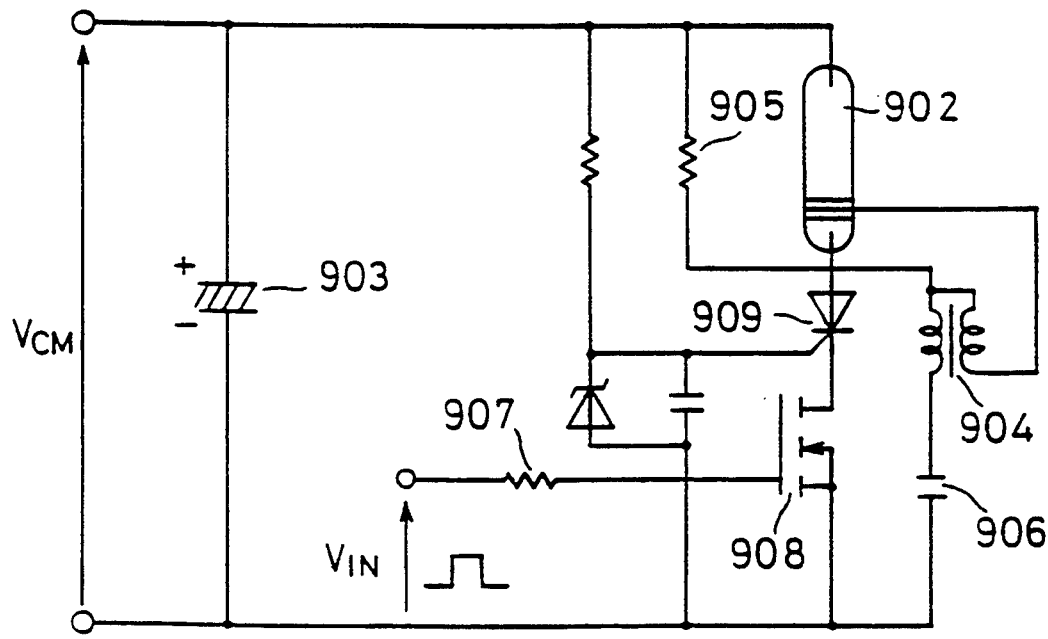

As a method to solve such problems the same inventors as those of this application have proposed a circuit shown in FIG. 21 (Japanese Patent Laying Open Gazette. No. 1-24399) wherein there is provided a low-priced flash control device with the MOSFET and the thyristor combined by a cascade connection. In this circuit, only when the MOSFET 908 is turned on, the thyristor 909 cascade-connected to it can be turned on. The MOSFET 908 may be prepared by a low breakdown voltage one. By combining such MOSFET 908 with the thyristor 909 of high breakdown voltage, switching flash discharge current with large current density becomes possible.

In FIG. 21, the thyristor 909 and the MOSFET 908 are formed by discrete elements. Accordingly it is difficult to make the flash control device small. On the other hand, according to the semiconductor device of the structures shown in FIGS. 8, 10, 11, 14, 16 and 17 according to the present invention, the cascade connection of the thyristor and the MOSFET is integrated on one chip semiconductor. Therefore, if the semiconductor device according to the present invention is used, a small-sized high performance flash control device can be implemented with ease. In the following a flash control device wherein a semiconductor device according to the present invention is applied as a switching element will be explained.

Figure 22:
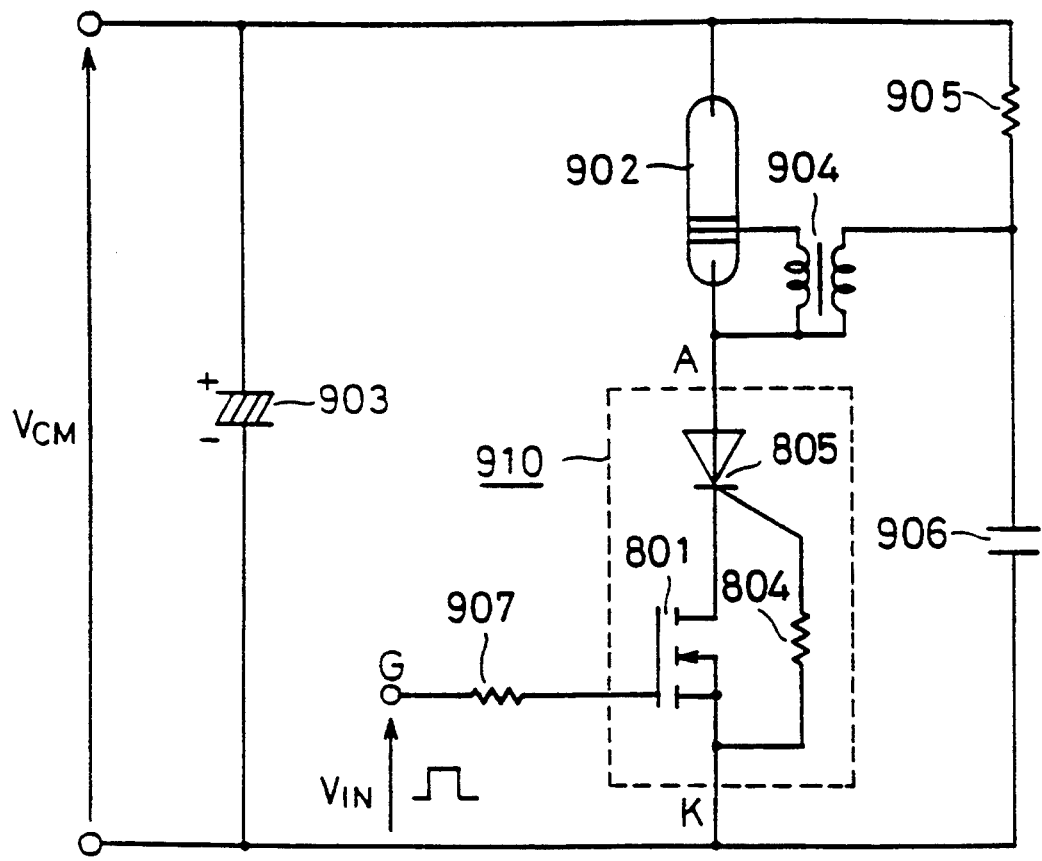
FIG. 22 is a circuit diagram showing an embodiment of a flash control device according to the present invention.

FIG. 22 is a circuit diagram showing an embodiment of a flash control device according to the present invention. Compared to the conventional flash control device shown in FIG. 20, it differes that instead of the IGBT 901 a semiconductor device 910 of the structure shown in FIG. 8 etc. according to the present invention is used as a switching element. Other structures are the same as those of the flash control device shown in FIG. 20. In the equivalent circuit of the semiconductor device 910 shown in FIG. 22, a thyristor 805 corresponds to the thyristor composed of the transistors 802 and 803 in the equivalent circuit shown in FIG. 9.

According to the semiconductor device 910 of the present invention, as stated before, current density of the device can be increased so that large current control can be conducted with a silicon chip of smaller area. In addition, upon turn-off, only application of OFF-level voltage to the gate terminal G is necessary to turn off the channel of the MOS transistor 801. The turn-off of the MOS transistor 801 cuts off the emitter current of the npn transistor 803 (FIG. 9) in the thyristor 805, so that the transistor 803 can be turned off high-speedy and precisely. In response to this, the thyristor 805 is unlatched. Accordingly failure of turn-off, which is seen in a semiconductor device such as a MCT and a MOSGTO which needs to shunt a path between the gate and the cathode of a thyristor by a MOS gate to be turned off does not occur. Accordingly, as described before, the blockable main current density can be increased. This advantage is important for usage especially such as a flash control device in which large current over around 1,000 A/cm$^2$ is desired to be cut off. Though around such current can be cut off in an IGBT, there are problems that a flashing efficiency lowers by increase of a ON state voltage as was described before or cut-off ability lowers by momentary elevation of a chip temperature due to current flow. Accordingly, in the IGBT, the main current density of around 700 A/cm$^2$ is practical limit.

As mentioned above, according to the flash control device of this embodiment, since the semiconductor device with excellent performance according to the present invention is used, there are advantages wherein high speed control the current of a flash discharge tube can easily be performed higher current density. Besides as only one gate terminal is necessary, a small-sized and low-priced flash control device which is highly compatible with the conventional flash control device using the IGBT can be implemented.

Figure 1:
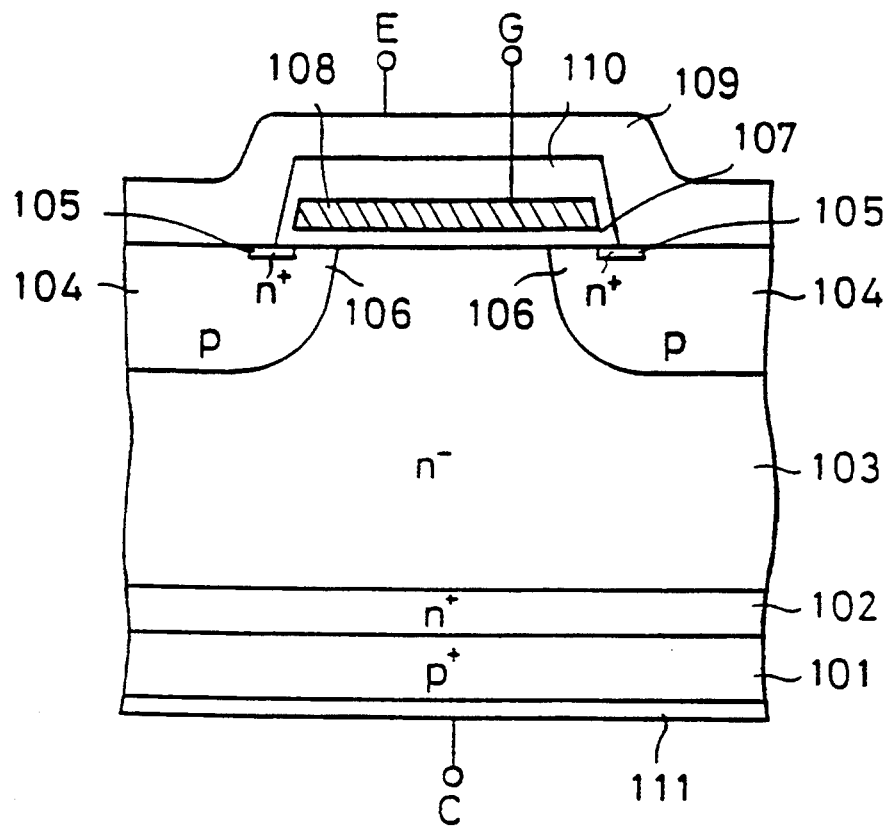
FIG. 1 is a cross-sectional view showing a conventional IGBT.
Figure 2:
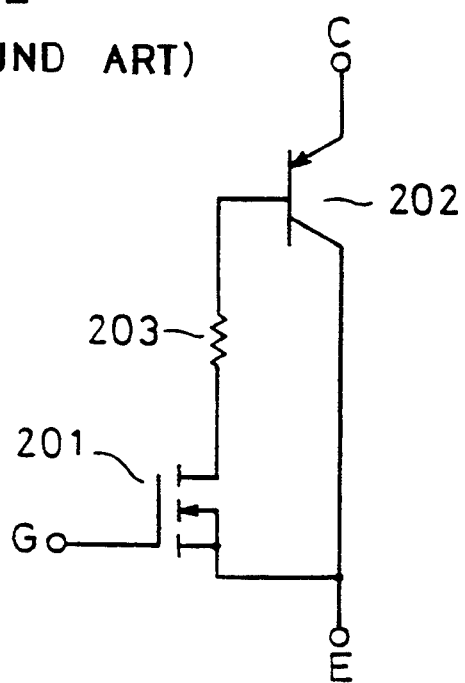
FIG. 2 is a circuit diagram showing the equivalent circuit thereof.
Figure 3:
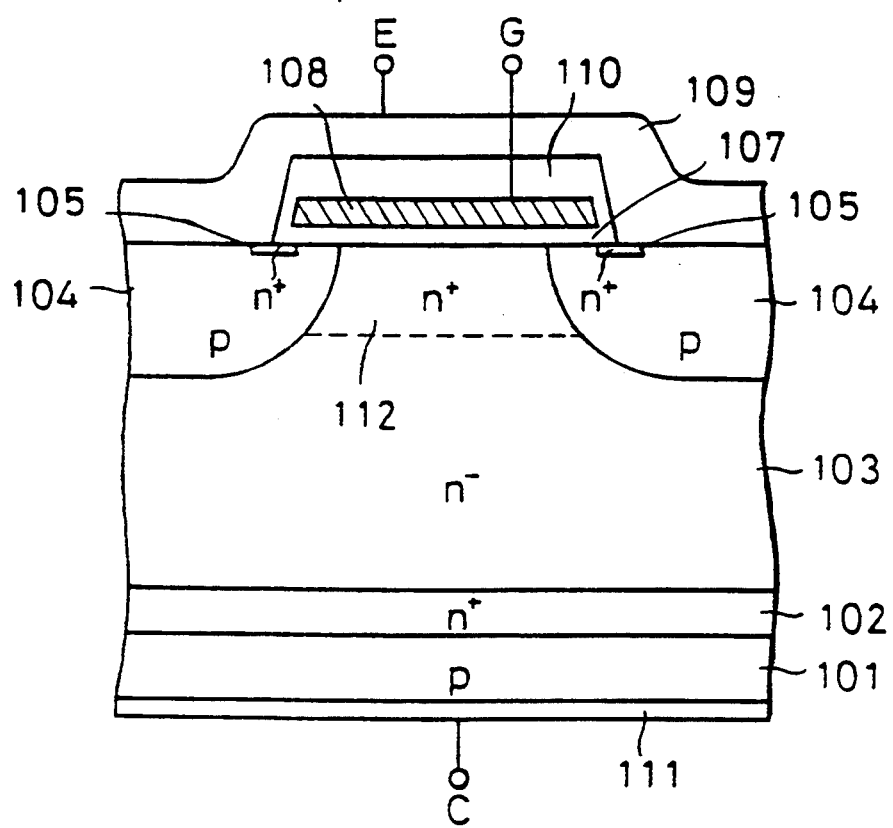
FIG. 3 is a cross-sectional view showing another conventional IGBT.
Figure 4:
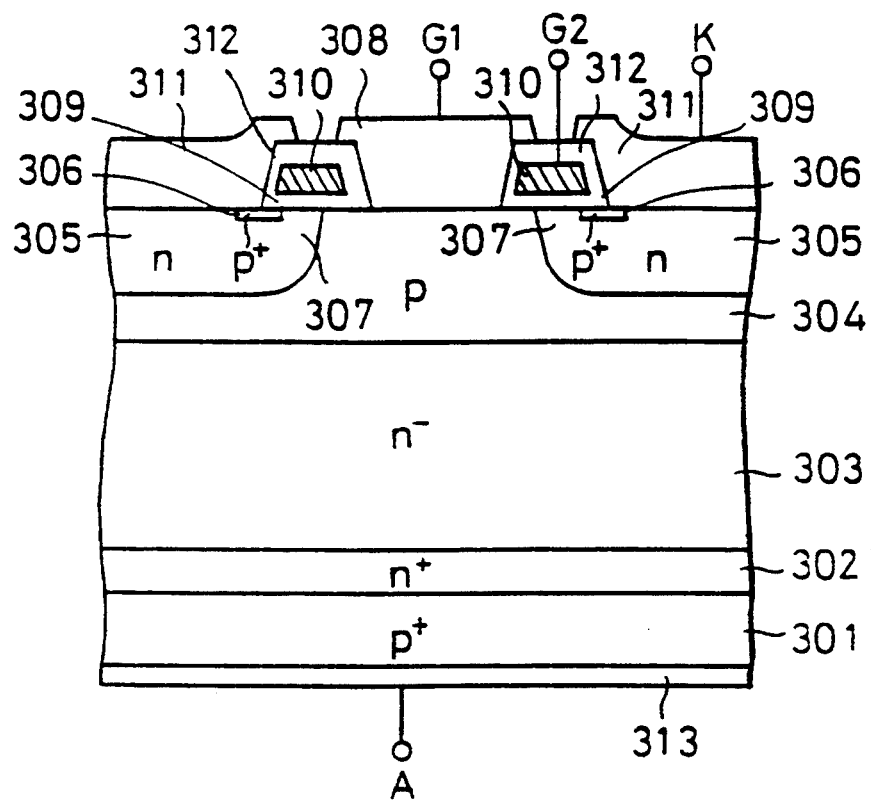
FIG. 4 is a cross-sectional view showing a conventional MOSGTO.
Figure 5:
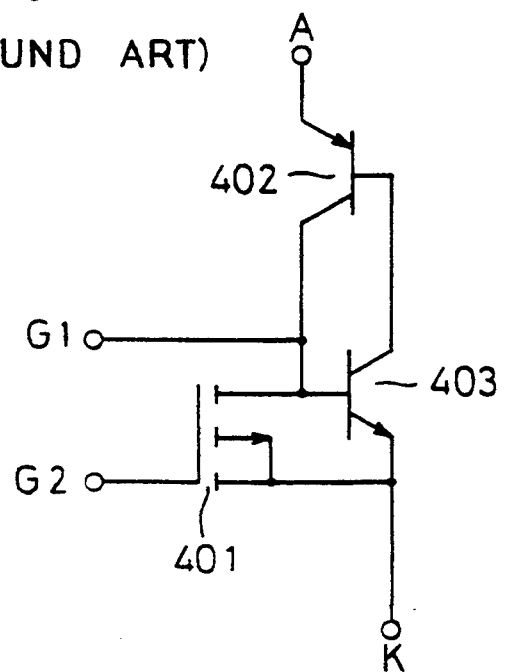
FIG. 5 is a circuit diagram showing the equivalent circuit thereof.
Figure 6:
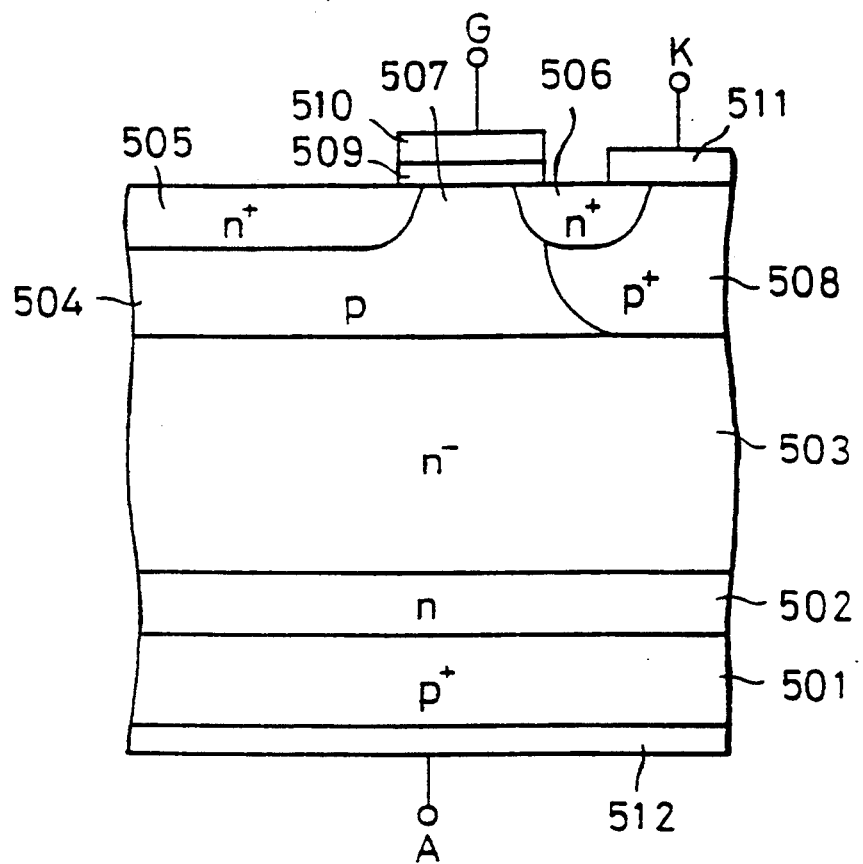
FIG. 6 is a cross-sectional view showing a conventional EST.
Figure 7:
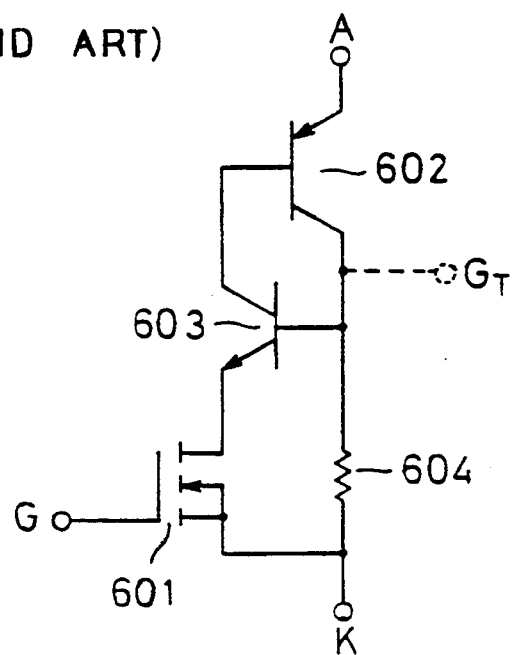
FIG. 7 is a circuit diagram showing the equivalent circuit thereof.

Provided that compatibility with the conventional flash control device using the IGBT is not considered, the number of the gate terminal G of the semiconductor device 910 may be two. Accordingly a semiconductor device having a structure similar to that shown for example in FIG. 8 but different in the following may be used for the semiconductor device 910 in FIG. 22: there is provided a means such as an additional gate electrode to inject, for turning-on, carriers into the p$^{--}$ type semiconductor region 704 in place that the region 704 is punched through under application of working voltage or service voltage. Further the EST shown in FIG. 6, wherein like the semiconductor device 910 of FIG. 22 the cascade connection of a thyristor and a MOSFET is formed on one chip, may be used instead of the semiconductor device 910 in FIG. 22.

As explained above, according to the present invention, since a MOSFET is cascade-connected on an equivalent circuit with one electrode of a thyristor, a first impurity concentration of a first semiconductor region is so set that the first semiconductor region is completely depleted under conditions that an actual working voltage is applied across first and second electrodes in an off state and besides a second impurity concentration of a second semiconductor region is so set that a threshold voltage of the MOSFET becomes predetermined value in an enhancement mode, the following is made possible: under conditions that the actual working voltage is applied across the first and second electrodes, by applying a bias voltage to the Gate electrode thyristor can immediately latch to turn on the semiconductor device and by eliminating the bias voltage the thyristor can immediately unlatch to turn off the semiconductor device. As a result the following various advantages can be obtained:

(1) Since a thyristor is built in, both high breakdown voltage and low ON state resistance can be satisfied.
(2) Since turning ON and OFF are made by cascade-connected MOSFET, blockable main current density can be increased.
(3) Since concentration of an electric field under voltage blocking conditions is moderated, high breakdown voltage can be implemented with ease.
(4) Since only one Gate electrode is provided so that only one Gate voltage of enhancement mode is sufficient for an ON/OFF control signal, a control circuit can be simplified.
(5) Since an amplification factor of a transistor in a thyristor may be lowered, high speed turn-off can be realized.
(6) Since there is only one gate electrode, chip area may be small so that high current density can be realized. As a result a product with higher cost performance can be provided.

In addition, since the present invention employs switching element composed of a thyristor element and 8 MOSFET which are cascade-connected and formed on a single chip, flash discharge current with high density can be cut off with ease and besides flashing efficiency can be kept high.

In addition, when the semiconductor device according to the present invention is used as a switching element, only one gate electrode is necessary so that a small-sized and low-priced flash control device, which has highly compatible with a conventional flash control device using a conventional IGBT, can be implemented.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A method of fabricating a semiconductor device, comprising the steps of:

preparing a first conductivity type first semiconductor layer having first and second major surfaces;

forming a second conductivity type second semiconductor layer on said first major surface of said first semiconductor layer;

selectively forming a first conductivity type first semiconductor region of relatively low first impurity concentration in a surface of said second semiconductor layer;

selectively forming a first conductivity type second semiconductor region of relatively high second impurity concentration in the surface of said second semiconductor layer adjacently to said first semiconductor region;

forming a second conductivity type third semiconductor region in at least a portion of a surface of said first semiconductor region;

selectively forming a second conductivity type fourth semiconductor region in a surface of said second semiconductor region at a distance from said first semiconductor region, surface portions of said first and second semiconductor regions between said third and fourth semiconductor regions being defined as a channel;

forming a gate insulation film on said channel;

forming a gate electrode on said gate insulation film;

forming a first main electrode to spread on said second and fourth semiconductor regions; and forming a second main electrode on said second major surface of said first semiconductor layer, wherein said first impurity concentration is so set that said first semiconductor region is completely depleted when a working voltage is applied across said first and second main electrodes in an off state of said semiconductor device, and said second impurity concentration is so set that said channel has a threshold voltage of a predetermined value in an enhancement mode.

2. A method of fabricating a semiconductor device in accordance with claim 1, wherein
said third and fourth semiconductor regions are simultaneously formed.

3. A method of fabricating a semiconductor device in accordance with claim 2, wherein
said third and fourth semiconductor regions are formed in a self-alignment manner by using said gate insulation film and said gate electrode as a mask.

4. A method of fabricating a semiconductor device, comprising the steps of:
preparing a first conductivity type first semiconductor layer having first and second major surfaces;
forming a second conductivity type second semiconductor layer on the first major surface of said first semiconductor layer;
forming a first conductivity type first semiconductor region of relatively low first impurity concentration on said second semiconductor layer;
forming a gate insulation film on said first semiconductor region;
selectively forming a gate electrode on said gate insulation film;
forming a first conductivity type second semiconductor region of relatively high second impurity concentration selectively in a surface of said first semiconductor region by coating said gate electrode on one-end side with mask material to introduce first conductivity type impurities into said first semiconductor region by using the mask material and said gate electrode as a mask;
forming second conductivity type third and fourth semiconductor regions selectively in surfaces of said first and second semiconductor regions, respectively, by removing said mask material and introducing second conductivity type impurities into said first and second semiconductor regions by using said gate electrode as a mask;
forming a first main electrode to spread on said second and fourth semiconductor regions; and forming a second main electrode on the second major surface of said first semiconductor layer, wherein
the surface between said third and fourth semiconductor regions is specified as a channel,
said first impurity concentration is so set that said first semiconductor region is completely depleted when a working voltage is applied across said first and second main electrodes in an off state of said semiconductor device, and said second impurity concentration is so set that said channel has a threshold voltage of a predetermined value in an enhancement mode.

5. A method of fabricating a semiconductor device in accordance with claim 4, wherein
the step of forming said first semiconductor region includes the step of diffusing heavy metal on a surface of said second semiconductor layer.

6. A method of fabricating a semiconductor device, comprising the steps of:
preparing a first conductivity type first semiconductor layer having first and second major surfaces;
forming a second conductivity type second semiconductor layer on the first major surface of said first semiconductor layer;
forming a gate insulation film on said second semiconductor layer;
selectively forming a gate electrode on said gate insulation film;
forming a first conductivity type first semiconductor region of relatively low first impurity concentration in an entire surface of said second semiconductor layer by introducing first conductivity type impurities into said second semiconductor layer through said gate electrode;
forming a first conductivity type second semiconductor region of relatively high second impurity concentration selectively in a surface of said first semiconductor region by coating said gate electrode on one-end side with mask material to introduce first conductivity type impurities into said first semiconductor region by using the mask material and said gate electrode as a mask;
forming second conductivity type third and fourth semiconductor regions selectively in surfaces of said first and second semiconductor regions, respectively, by removing said mask material and introducing second conductivity type impurities into said first and second semiconductor regions by using said gate electrode as a mask;
forming a first main electrode to spread on said second and fourth semiconductor regions; and
forming a second main electrode on the second major surface of said first semiconductor layer, wherein
the surface between said third and fourth semiconductor regions is specified as a channel,
said first impurity concentration is so set that said first semiconductor region is completely depleted when a working voltage is applied across said first and second main electrodes in an off state of said semiconductor device, and
said second impurity concentration is so set that said channel has a threshold voltage of a predetermined value in an enhancement mode.

* * * * *